(12) United States Patent
Akiyama et al.

(10) Patent No.: US 10,026,877 B2
(45) Date of Patent: Jul. 17, 2018

(54) LED MODULE

(71) Applicants: CITIZEN WATCH CO., LTD., Nishitokyo-shi (JP); CITIZEN ELECTRONICS CO., LTD., Fujiyoshida-shi, Yamanashi (JP)

(72) Inventors: Takashi Akiyama, Sayama (JP); Tatsuro Yamada, Fujiyoshida (JP); Satoshi Goto, Yamanashi (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 15/515,334

(22) PCT Filed: Sep. 29, 2015

(86) PCT No.: PCT/JP2015/077592
§ 371 (c)(1),
(2) Date: Mar. 29, 2017

(87) PCT Pub. No.: WO2016/052550
PCT Pub. Date: Apr. 7, 2016

(65) Prior Publication Data
US 2017/0236982 A1 Aug. 17, 2017

(30) Foreign Application Priority Data
Sep. 29, 2014 (JP) ................................. 2014-198161

(51) Int. Cl.
*H01L 33/00* (2010.01)
*H01L 33/50* (2010.01)
(Continued)

(52) U.S. Cl.
CPC ........ *H01L 33/504* (2013.01); *H01L 25/0753* (2013.01); *H01L 33/505* (2013.01);
(Continued)

(58) Field of Classification Search
CPC ............................ H01L 33/504; H01L 33/505
See application file for complete search history.

(56) References Cited

U.S. PATENT DOCUMENTS

| | | | |
|---|---|---|---|
| 2011/0050071 A1 | 3/2011 | Chung et al. | |
| 2013/0249411 A1 | 9/2013 | Takahashi et al. | |

(Continued)

FOREIGN PATENT DOCUMENTS

| | | | |
|---|---|---|---|
| JP | 2008218485 A | 9/2008 | |
| JP | 2011049516 A | 3/2011 | |

(Continued)

OTHER PUBLICATIONS

International Preliminary Report on Patentability and Written Opinion of the International Searching Authority with English language translation for PCT/JP2015/077592, dated Apr. 4, 2017, 5 pages.

(Continued)

*Primary Examiner* — Jamie C Niesz
(74) *Attorney, Agent, or Firm* — RatnerPrestia

(57) ABSTRACT

An LED module according to the present invention includes: a mounting substrate; a first LED group including a plurality of LEDs mounted in a first light-emitting area extending in a first direction on the mounting substrate; a second LED group including a plurality of LEDs mounted in a second light-emitting area located outside the first light-emitting area; a dam material surrounding a periphery of the second light-emitting area; a first fluorescent resin coating the first LED group and causing the first light-emitting area to emit light having a first color temperature; and a second fluorescent resin coating at least the second LED group and causing the second light-emitting area to emit light having a second color temperature higher than the first color temperature, and viscosity of the first fluorescent resin is higher than viscosity of the second fluorescent resin.

7 Claims, 15 Drawing Sheets

(51) Int. Cl.
*H01L 25/075* (2006.01)
*H01L 33/62* (2010.01)
*H01L 33/54* (2010.01)
*H01L 33/56* (2010.01)
*H05B 33/08* (2006.01)

(52) U.S. Cl.
CPC .............. *H01L 33/54* (2013.01); *H01L 33/56* (2013.01); *H01L 33/62* (2013.01); *H05B 33/0827* (2013.01); *H05B 33/0845* (2013.01)

(56) References Cited

U.S. PATENT DOCUMENTS

| | | | | |
|---|---|---|---|---|
| 2014/0055996 | A1* | 2/2014 | Shimozawa | F21K 9/56 362/235 |
| 2014/0367710 | A1* | 12/2014 | Akiyama | H01L 25/167 257/88 |
| 2016/0149094 | A1* | 5/2016 | Onuma | H01L 25/0753 257/89 |

FOREIGN PATENT DOCUMENTS

| | | | | | |
|---|---|---|---|---|---|
| JP | 2011096739 | A | | 5/2011 | |
| JP | 2013120812 | A | | 6/2013 | |
| JP | WO 2013/094700 | A1 | * | 6/2013 | ............. H01L 33/48 |
| JP | 2013182917 | A | | 9/2013 | |
| JP | 2013201354 | A | | 10/2013 | |
| JP | 2014045089 | A | | 3/2014 | |
| JP | 2014049504 | A | | 3/2014 | |
| JP | WO 2014/203839 | A1 | * | 12/2014 | ............. H01L 33/48 |
| JP | 2015084397 | A | | 4/2015 | |

OTHER PUBLICATIONS

International Search Report for PCT/JP2015/077592, dated Dec. 22, 2015, 3 pages.

* cited by examiner

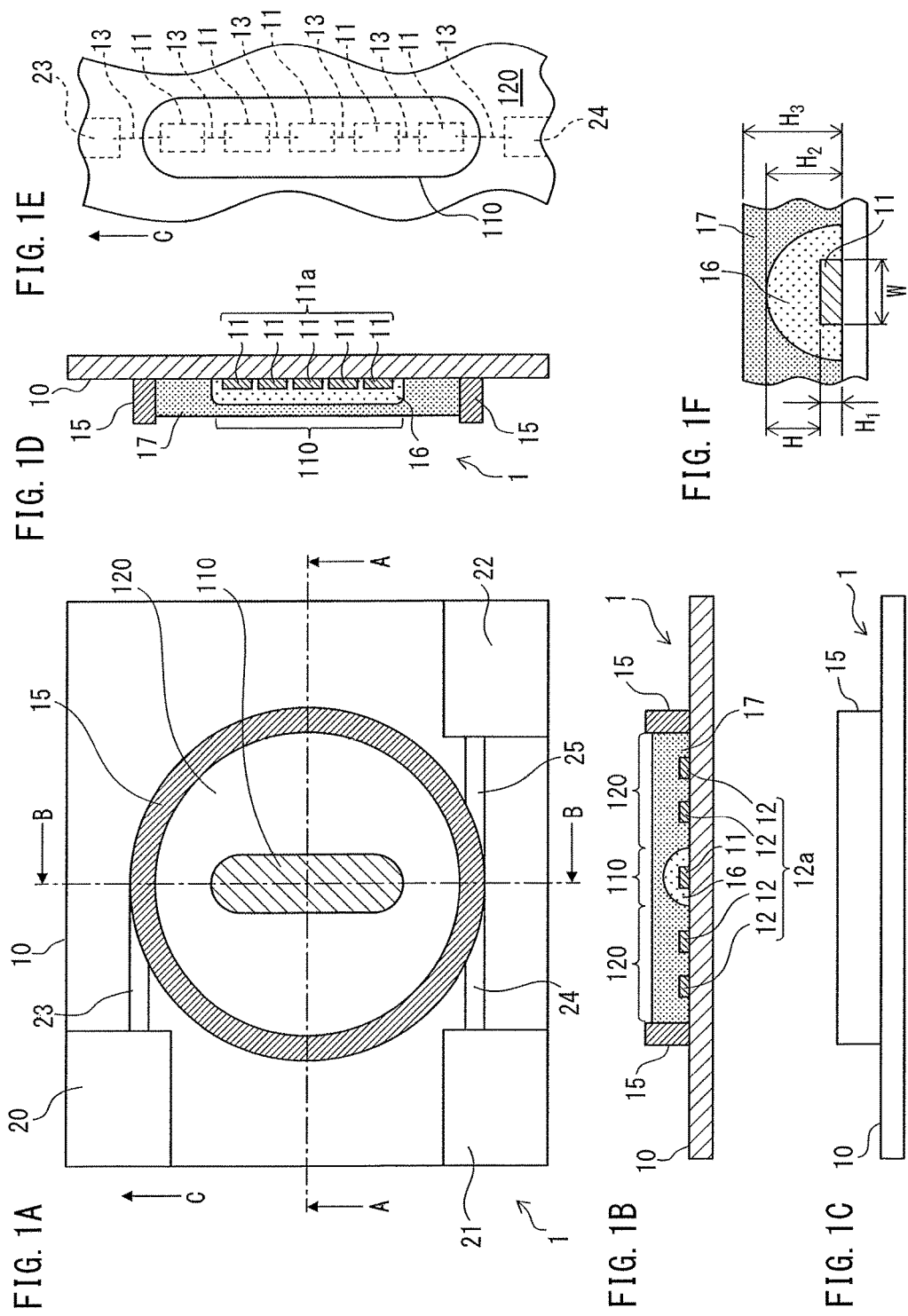

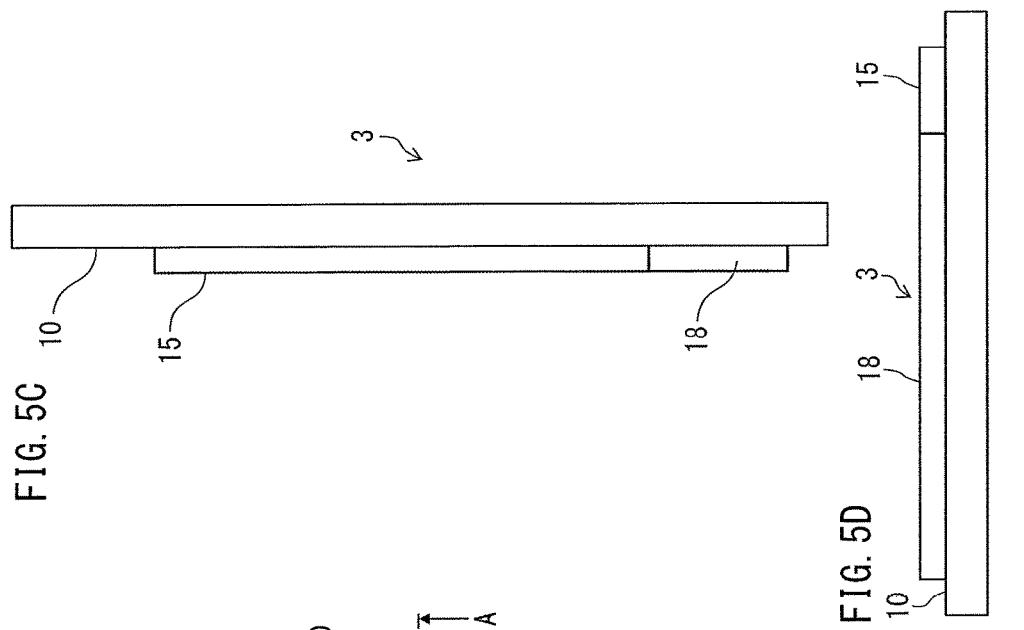
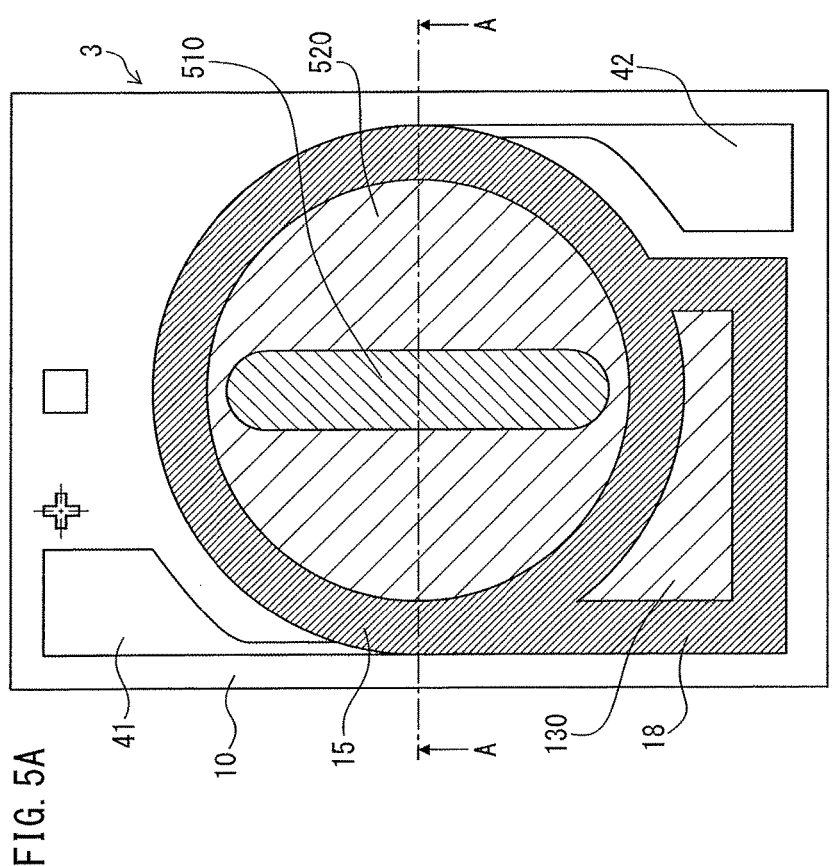
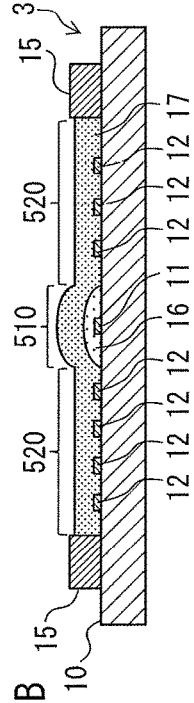

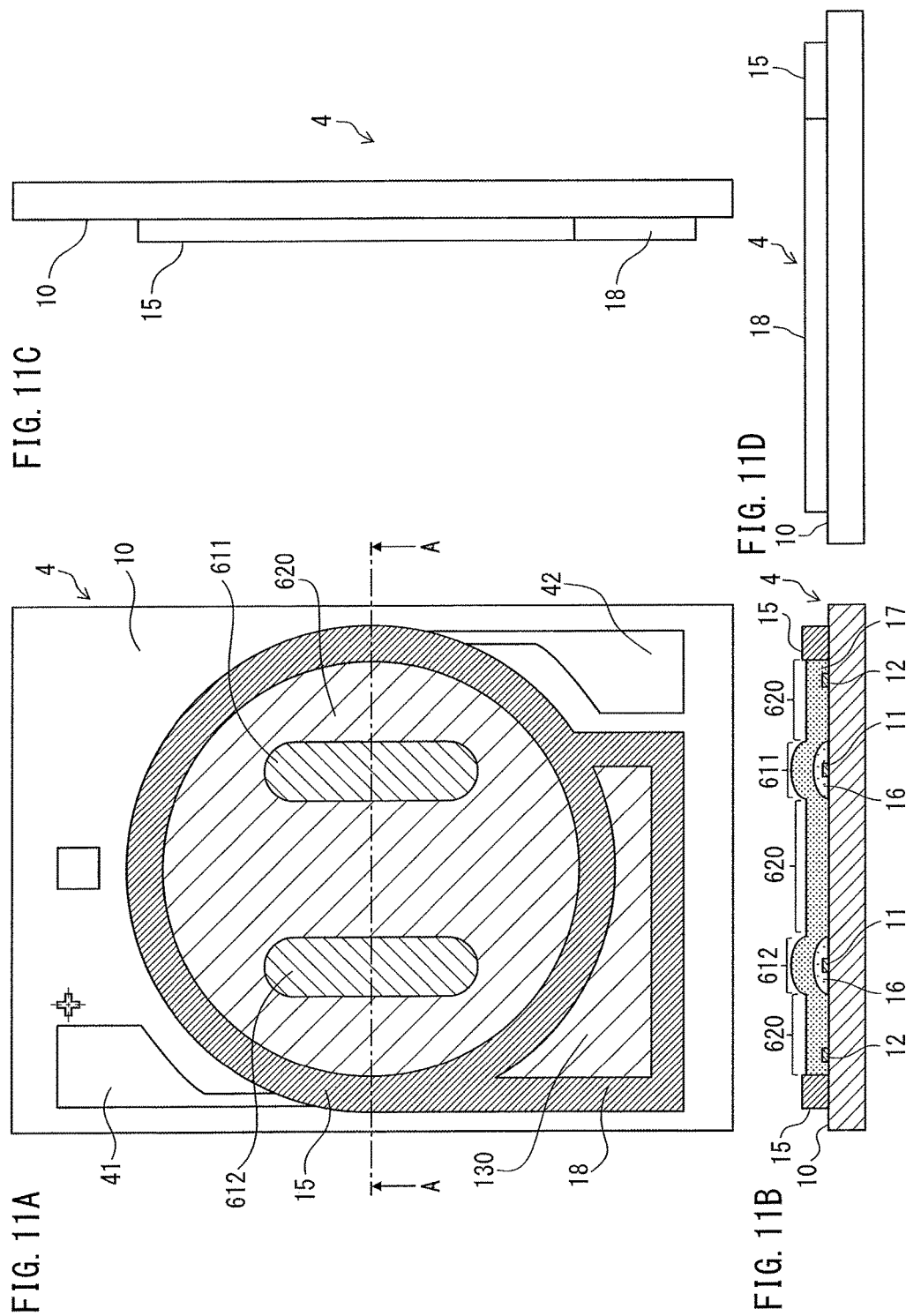

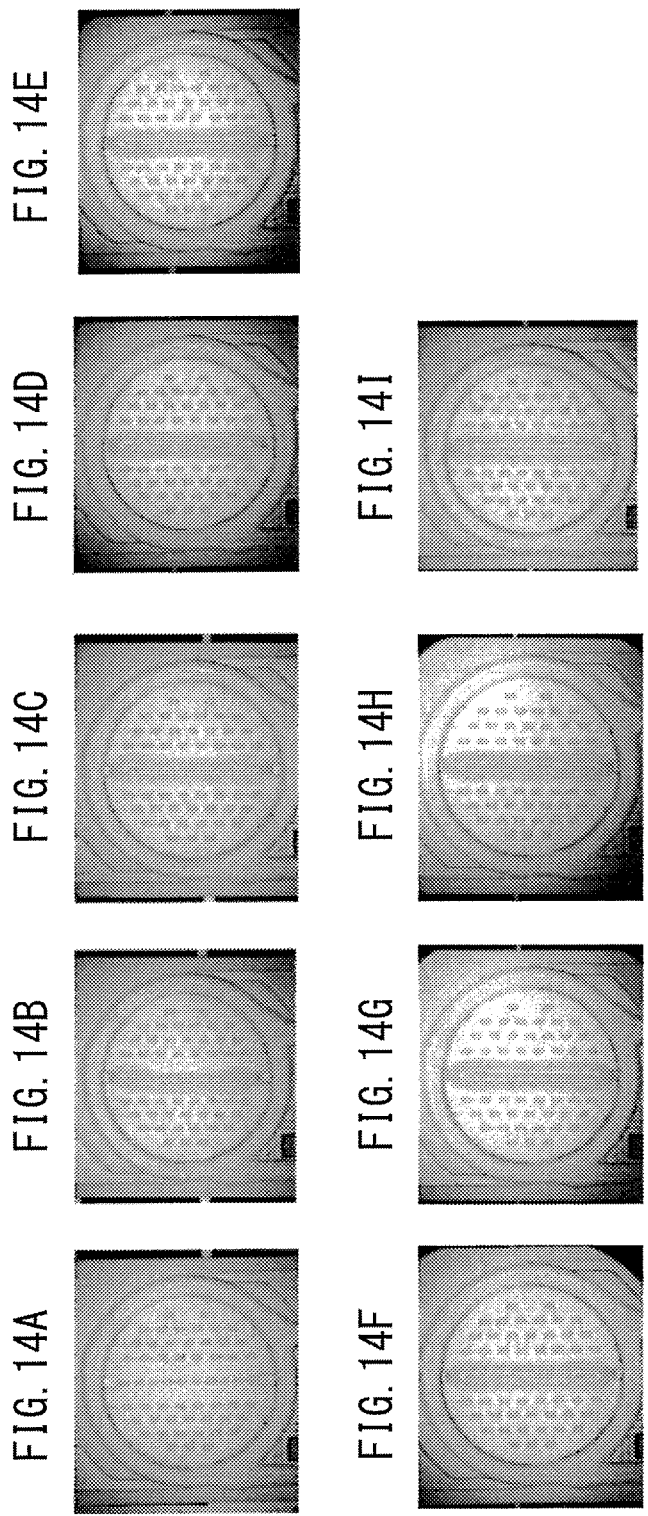

LED MODULE

CROSS REFERENCE TO RELATED APPLICATIONS

This is the U.S. National Phase application of PCT/JP2015/077592, filed Sep. 29, 2015, which claims priority to Japanese Patent Application No. 2014-198161, filed Sep. 29, 2014, the disclosures of these applications being incorporated herein by reference in their entireties for all purposes.

FIELD

The embodiments discussed herein are related to an LED module in which two areas whose emitted light colors are different are formed on a mounting substrate on which a plurality of LEDs is mounted.

BACKGROUND

An LED module is known, which includes at least two areas including mounted LEDs as components on a mounting substrate on which a plurality of LEDs is mounted and is capable of implementing high color rendering properties and a color control function by emitting light whose emitted light colors are different from the at least two areas (see Patent Document 1 to Patent Document 7). For example, the LED module described in Patent Document 1 includes a plurality of belt-shaped light-emitting areas each of which emits light having one of a first emitted light color and a second emitted light color.

FIG. 15 is a plan view of an LED module, which is a light-emitting device including a plurality of belt-shaped light-emitting areas.

An LED module 801 includes a mounting substrate, not illustrated, a first light-emitting unit group 811 that emits light having a first color temperature, a second light-emitting unit group 812 that emits light having a second color temperature, a first power source 813, a second power source 814, and a controller 815. Each of the first light-emitting unit group 811 and the second light-emitting unit group 812 is arranged on the mounting substrate in a predetermined array pattern. The first power source 813 and the second power source 814 are isolated from each other. The first light-emitting unit group 811 is supplied with a current from the first power source 813 and the second light-emitting unit group 812 is supplied with a current from the second power source 814. The controller controls a ratio between the currents supplied to the first light-emitting unit group 811 and the second light-emitting unit group 812 from the first power source 813 and the second power source 814, respectively.

The first light-emitting unit group 811 has a plurality of LED chips 821 that emit blue light and a first phosphor layer 831 that seals the plurality of LED chips 821 and includes a first phosphor. The second light-emitting unit group 812 has a plurality of LED chips 822 that emit blue light, a second phosphor layer 832 that seals the LED chips 822, and a second phosphor layer 812 that is arranged on the second phosphor layer 832 and includes a second phosphor. The second light-emitting unit group 812 emits light having a color temperature lower than that of the light emitted by the first light-emitting unit group 811.

In the LED module 801, a belt-shaped pattern may be visually recognized on an irradiation surface. In order to prevent the belt-shaped pattern from being visually recognized on the irradiation surface, Patent Document 1, describes the embodiment in which a first light-emitting unit group that emits a first emitted light color and a light-emitting unit group that emits a second emitted light color are arrayed in the form of a checkered pattern to improve color mixing properties. However, if the light-emitting unit group that emits the second emitted light color is arrayed in the form of a checkered pattern, there is such a problem that the wiring system structure and the manufacturing process of the LED module become complicated.

It is known that the light-emitting area is circularly formed, in order to make easy optical design of a lens or the like, as well as to prevent an arrangement pattern of a light-emitting area from being visually recognized. For example, Patent Document 8 describes an LED module in which two areas are arranged concentrically.

FIG. 16 is a plan view of an LED module 901 in which two areas are arranged concentrically.

The LED module 901 includes a mounting substrate 900, a light-emitting unit 910 including a first LED 911 and a second LED 912, a dam material 920 including a first dam material 921 and a second dam material 922, and a fluorescent resin 930 including a first fluorescent resin 931 and a second fluorescent resin 932. The first dam material 921 and the second dam material 922 are concentric dam materials and the first dam material 921 is arranged inside the second dam material 922. A first light-emitting area N1 including the first LED 911 and the first fluorescent resin 931 is formed inside the first dam material 921. A second light-emitting area N2 including the second LED 912 and the second fluorescent resin 932 is formed between the first dam material 921 and the second dam material 922. The first light-emitting area N1 and the second light-emitting area N2 emit light having color temperatures different from each other. For example, the color temperature of the first light-emitting area N1 is 3,500 K and the color temperature of the second light-emitting area N2 is 6,500 K. The first light-emitting area N1 and the second light-emitting area N2 are circular, and therefore the LED module 901 may implement illumination light with high color mixing properties by comparatively easy optical design.

RELATED DOCUMENTS

[Patent Document 1] Japanese Laid Open Patent Document No. 2008-218485

[Patent Document 2] Japanese Laid Open Patent Document No. 2011-96739

[Patent Document 3] Japanese Laid Open Patent Document No. 2013-120812

[Patent Document 4] Japanese Laid Open Patent Document No. 2013-182917

[Patent Document 5] Japanese Laid Open Patent Document No. 2013-201354

[Patent Document 6] Japanese Laid Open Patent Document No. 2014-49504

[Patent Document 7] Japanese Laid Open Patent Document No. 2015-84397

[Patent Document 8] Japanese Laid Open Patent Document No. 2011-49516

SUMMARY

Problems to be Solved by the Invention

However, in the LED module 901 illustrated in FIG. 16, the first dam material 921 is arranged inside the second dam material 922, and therefore the substrate size may increases because the arrangement area of the first dam material 921 is secured.

Thus, the present invention has been made in light of the above-described problem and an object is to provide an LED module whose mounting substrate can be downsized.

Means for Solving the Problem

In order to achieve the above-described object, an LED module according to the present invention includes: a mounting substrate; a first LED group including a plurality of LEDs mounted in a first light-emitting area extending in a first direction on the mounting substrate; a second LED group including a plurality of LEDs mounted in a second light-emitting area located outside the first light-emitting area; a dam material surrounding a periphery of the second light-emitting area; a first fluorescent resin coating the first LED group and causing the first light-emitting area to emit light having a first color temperature; and a second fluorescent resin coating at least the second LED group and causing the second light-emitting area to emit light having a second color temperature higher than the first color temperature, and viscosity of the first fluorescent resin is higher than viscosity of the second fluorescent resin.

Further, in the LED module according to the present invention, it is preferable for the first fluorescent resin and the second fluorescent resin to be connected directly without intervention of the dam material.

Further, in the LED module according to the present invention, it is preferable for a length between a vertex portion of the first fluorescent resin and a top surface of the LED coated with the first fluorescent resin to be longer than a length in a width direction perpendicular to the first direction of the LED coated with the first fluorescent resin.

Further, in the LED module according to the present invention, it is preferable for each of the plurality of LEDs included in the first LED group to have a rectangular planar shape and for each of the plurality of LEDs included in the first LED group to be arranged so that an extending direction of a long side is parallel to the first direction.

Further, in the LED module according to the present invention, it is preferable for an extending direction of all wires connecting between the plurality of LEDs included in the first LED group to be parallel to the first direction.

Further, in the LED module according to the present invention, it is preferable for an outer contour of the second light-emitting area to be circular.

Further, in the LED module according to the present invention, it is preferable for a section perpendicular to the first direction of the first fluorescent resin to be hemispheric.

Further, in the LED module according to the present invention, it is preferable to further include a current limiting circuit configured to control light emission of the LEDs included in the first LED group and the second LED group so as to enter a first light-emitting state where the LEDs included in the first LED group are caused to emit light and the LEDs included in the second LED group are not caused to emit light, a second light-emitting state where the LEDs included in the first LED group and the second LED group are caused to emit light, and a third light-emitting state where the LEDs included in the first LED group are not caused to emit light and the LEDs included in the second LED group are caused to emit light.

Further, in the LED module according to the present invention, it is preferable for the current limiting circuit to decrease a current supplied to the LEDs included in the first LED group as a current supplied to the LEDs included in the first LED group and the second LED group increases in the second light-emitting state.

Advantageous Effect of the Invention

In the LED module according to the present invention, the mounting substrate may be downsized.

BRIEF DESCRIPTION OF THE DRAWINGS

FIG. 1A is a plan view of an LED module according to a first embodiment;

FIG. 1B is a sectional view along AA line illustrated in FIG. 1A;

FIG. 1C is a front view illustrated in FIG. 1A;

FIG. 1D is a sectional view along BB line illustrated in FIG. 1A;

FIG. 1E is a partially enlarged perspective view of the vicinity of a first light-emitting area of the plan view illustrated in FIG. 1A;

FIG. 1F is a partially enlarged view of the sectional view illustrated in FIG. 1B

FIG. 5A is a plan view of an LED module according to a third embodiment;

FIG. 5B is a sectional view along AA line illustrated in FIG. 5A;

FIG. 5C is a right side view of the LED module illustrated in FIG. 5A;

FIG. 5D is a front view of the LED module illustrated in FIG. 5A;

FIG. 11A is a plan view of an LED module according to a fourth embodiment;

FIG. 11B is a sectional view along AA line illustrated in FIG. 11A;

FIG. 11C is a right side view of the LED module illustrated in FIG. 11A;

FIG. 11D is a front view of the LED module illustrated in FIG. 11A;

FIG. 14A illustrates a planar image in the state where the first fluorescent resin 16 is not arranged;

FIG. 14B illustrates a planar image of the first light-emitting area when the length is 3.4 mm;

FIG. 14C illustrates a planar image of the first light-emitting area when the length is 3.8 mm;

FIG. 14D illustrates a planar image of the first light-emitting area when the length is 4.0 mm;

FIG. 14E illustrates a planar image of the first light-emitting area when the length is 4.2 mm;

FIG. 14F illustrates a planar image of the first light-emitting area when the length is 4.6 mm;

FIG. 14G illustrates a planar image of the first light-emitting area when the length is 4.8 mm;

FIG. 14H illustrates a planar image of the first light-emitting area when the length is 5.0 mm;

FIG. 14I illustrates a planar image of the first light-emitting area when the length is 5.4 mm;

DESCRIPTION OF EMBODIMENTS

Figure 2A:
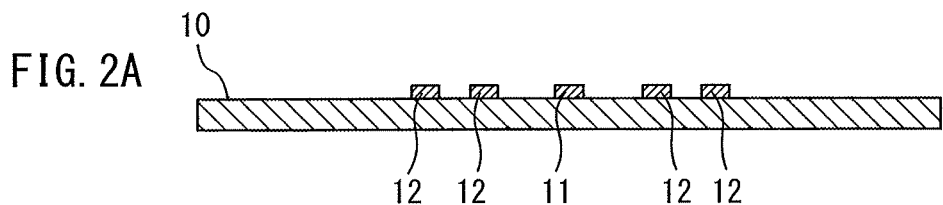
FIG. 2A illustrates a first process of the LED module illustrated in FIG. 1A.

In the following, with reference to the drawings, preferred embodiments of the present invention are explained in detail. In explanation of the drawings, the same symbol is attached to the same or corresponding component and duplicated explanation is omitted. In order to make explanation easy, scale or the like is changed appropriately.

First Embodiment

FIG. 1A is a plan view of an LED module 1 according to a first embodiment, FIG. 1B is a sectional view along AA line illustrated in FIG. 1A, FIG. 1C is a front view, and FIG. 1D is a sectional view along BB line illustrated in FIG. 1A of the LED module 1. FIG. 1E is a partially enlarged perspective view of the vicinity of a first light-emitting area of the plan view illustrated in FIG. 1A and FIG. 1F is a partially enlarged view of the sectional view illustrated in FIG. 1B.

The LED module 1 has a mounting substrate 10, a plurality of first LEDs 11, a plurality of second LEDs 12, a dam material 15, a first fluorescent resin 16, and a second fluorescent resin 17. The plurality of first LEDs 11 and the first fluorescent resin 16 are arranged in a first light-emitting area 110 and the plurality of second LEDs 12 and the second fluorescent resin 17 are arranged in a second light-emitting area 120. The first light-emitting area 110 has a rod-like planar shape extending in a first direction indicated by an arrow C in FIG. 1A. The second light-emitting area 120 is located outside the first light-emitting area 110 and the outer contour of the second light-emitting area 120 comes into contact with an inner wall of the dam material 15 having an annular planner shape. The outer contour of the second light-emitting area comes into contact with the inner wall of the dam material 15 having an annular planar shape, and therefore the second light-emitting area 120 has a circular planar shape.

The mounting substrate 10 is formed by ceramic, such as alumina, whose thermal conductivity and reflectance are good. The thickness of the mounting substrate 10 is about 500 to 700 μm. On the top surface of the mounting substrate 10, an anode electrode 20, a first cathode electrode 21, a second cathode electrode 22, an anode wiring system 23, a first cathode wiring system 24, and a second cathode wiring system 25 are formed.

Each of the plurality of first LEDs 11 and the plurality of second LEDs 12 is a blue light-emitting diode. Each of the plurality of first LEDs 11 and the plurality of second LEDs 12 has a plane size of 500 μm×290 μm and a thickness $H_1$ of 200 μm.

The plurality of first LEDs 11 is connected in series via a wire 13 and forms a first LED group 11a. The anode of the first LED group 11a is connected to the anode electrode 20 via the wire 13 and the anode wiring system 23 and the cathode of the first LED group 11a is connected to the first cathode electrode 21 via the wire 13 and the first cathode wiring system 24.

Each of the plurality of first LEDs 11 has a rectangular planar shape and is arranged so that the extending direction of the long side is parallel to the first direction indicated by the arrow C and the extending direction of the short side is perpendicular to the first direction. In the vicinity of each short side of the plurality of first LEDs 11, an anode and a cathode are formed and the anode and the cathode of the first LEDs 11 adjacent to each other are connected by the wire 13. The plurality of first LEDs 11 is arranged so that the extending direction of the long side is parallel to the first direction indicated by the arrow C and in the vicinity of each short side of the plurality of first LEDs 11, the anode and the cathode are formed, and therefore the extending direction of the wire 13 when the wire 13 is viewed in a plan view is parallel to the first direction.

The plurality of second LEDs 12 is connected in series via a wire and a wiring system, not illustrated, and forms a second LED group 12a. The number of second LEDs 12 included in the second LED group 12a is larger than the number of first LEDs 11 included in the first LED group 11a. The anode of the second LED group 12a is connected to the anode electrode 20 via the anode wiring system 23 and the cathode of the second LED group 12a is connected to the second cathode electrode 22 via the second cathode wiring system 25.

The dam material 15 is a wall material to dam the second fluorescent resin 17 when the area inside the dam material 15 is filled with the second fluorescent resin 17. The dam material 15 is made of a silicone resin and has a width of 0.7 to 1.0 mm and a height of 0.5 to 0.9 mm.

The first fluorescent resin 16 is formed by curing a silicone resin containing a phosphor that emits light in a color between orange and red when irradiated with blue light. The first fluorescent resin 16 has a semicircular section and a height $H_2$ from the top surface of the mounting substrate 10 to the vertex of the first fluorescent resin 16 is 500 to 800 μm. The viscosity of the first fluorescent resin 16 before being cured is higher than the viscosity of the second fluorescent resin 17 before being cured. In an example, the viscosity of the first fluorescent resin 16 and the second fluorescent resin 17 is measured by an E-type viscometer. In the present specification, the viscosity of a resin, such as the viscosity of the first fluorescent resin 16 and the second fluorescent resin 17, refers to the viscosity of a resin before being cured.

The second fluorescent resin 17 is formed by curing a silicone resin containing a phosphor that emits light in yellow when irradiated with blue light. The top surface of the second fluorescent resin 17 is flat and a height $H_3$ from the top surface of the mounting substrate 10 to the top surface of the second fluorescent resin 17 is 600 to 900 μm. A distance between the vertex of the first fluorescent resin 16 and the second fluorescent resin 17 is 100 to 300 μm.

When the plurality of first LEDs 11 emits light, the first light-emitting area 110 emits light having the first emitted light color and when the plurality of second LEDs 12 emits light, the second light-emitting area 120 emits light having the second emitted light color whose color temperature is higher than that of the first emitted light color. The color temperature of the first emitted light color is, for example, about 1,600 K and the first emitted light color is obtained by a combination of the first LED 11 that emits blue light and the first fluorescent resin 16 including a phosphor that emits light in a color between orange and red. The color temperature of the second emitted light color is, for example, about 2,700 K and the second emitted light color is obtained by a combination of the second LED 12 that emits blue light and the second fluorescent resin 17 including a phosphor that emits yellow light.

In the LED module 1, a length H between the vertex portion of the first fluorescent resin 16 and the top surface of the first LED 11 coated with the first fluorescent resin 16 is longer than a length W in the width direction perpendicular to the first direction of the first LED 11 coated with the first fluorescent resin 16. The length H between the vertex portion of the first fluorescent resin 16 and the top surface of the first LED 11 coated with the first fluorescent resin 16 is the difference between the height $H_2$ of the first fluorescent resin 16 and the height $H_1$ of the first LED 11.

In the LED module 1, the length H between the vertex portion of the first fluorescent resin 16 and the top surface of the first LED 11 is longer than the length W in the width direction of the first LED 11, and therefore "waviness" may be prevented in which the side surface of the first fluorescent resin 16 deforms when the first fluorescent resin 16 is cured by heat or ultraviolet rays. In the case where the amount of the first fluorescent resin 16 is small, if the first fluorescent resin 16 is applied unevenly so as to cluster on one of the side surfaces of the first LED 11 arrayed so as to extend in the first direction, when the first fluorescent resin 16 is cured by heat or ultraviolet rays, "waviness" may occur. If "waviness" occurs in the first fluorescent resin 16, the light emitted from the side surface of the first LED 11 may be emitted without intervention of the first fluorescent resin 16 and light having a color temperature different from the target color temperature is emitted from the first light-emitting area 110.

In the LED module 1, the occurrence of "waviness" is prevented by forming the first light-emitting area 110 by the first fluorescent resin 16 in the amount with which the length H between the vertex portion of the first fluorescent resin 16 and the top surface of the first LED 11 becomes longer than the length W in the width direction of the first LED 11. The maximum amount of the first fluorescent resin 16 is the amount with which the first fluorescent resin 16 may not stick to the second LED 12 adjacent thereto.

Figure 2B:
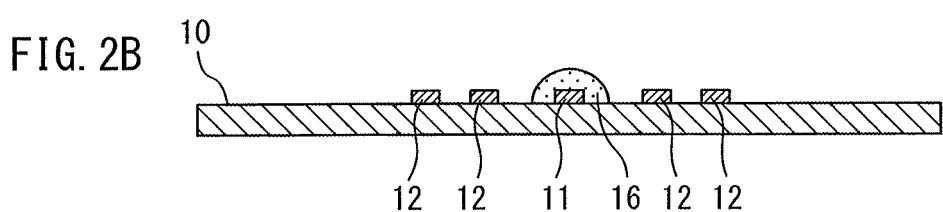
FIG. 2B illustrates a second process of the LED module illustrated in FIG. 1A.
Figure 2C:
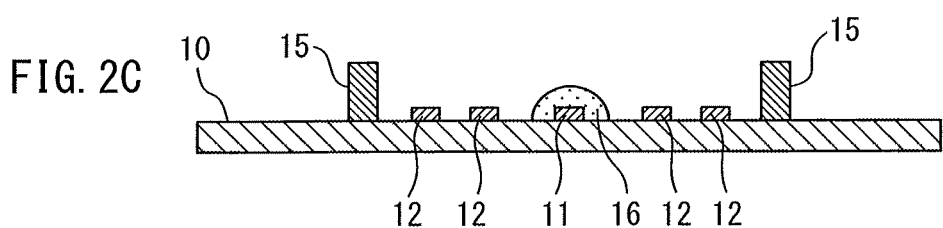
FIG. 2C illustrates a third process of the LED module illustrated in FIG. 1A.
Figure 2D:
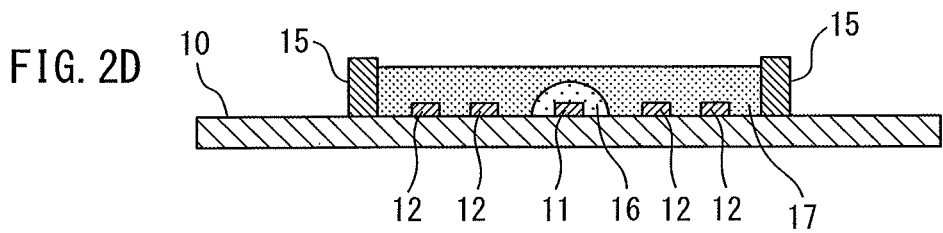
FIG. 2D illustrates a fourth process of the LED module illustrated in FIG. 1A.

FIG. 2A to FIG. 2D are diagrams explaining a manufacturing method of the LED module 1 and FIG. 2A illustrates a first process, FIG. 2B illustrates a second process, FIG. 2C illustrates a third process, and FIG. 2D illustrates a fourth process.

In the first process, the mounting substrate 10 is prepared on which the first LED group 11a including a plurality of first LEDs 11 and the second LED group 12a including a plurality of second LEDs 12 are mounted. Each of the plurality of first LEDs 11 and the plurality of second LEDs 12 is die-bonded to the mounting substrate 10. The anodes of the first LED group 11a and the second LED group 12a are connected to the anode electrode 20 formed on the top surface of the mounting substrate 10 via a wire and the anode wiring system 23, not illustrated. The cathode of the first LED group 11a is connected to the first cathode electrode 21 formed on the top surface of the mounting substrate 10 via a wire and the first cathode wiring system 24, not illustrated. The cathode of the second LED group 12a is connected to the second cathode electrode 22 formed on the top surface of the mounting substrate 10 via a wire and the second cathode wiring system 25, not illustrated. The plurality of first LEDs 11 and the plurality of second LEDs 12 may be flip-chip-mounted on the mounting substrate 10.

In the second process, the first fluorescent resin 16 before being cured is applied onto the top surface corresponding to the first light-emitting area 110 of the mounting substrate 10 with a dispenser. Because the viscosity of the first fluorescent resin 16 is high, the section of the first fluorescent resin 16 when applied becomes semicircular. Although a fillet may be formed at the bottom portion when the first fluorescent resin 16 is applied, the width of the first light-emitting area 110 may be reduced by making semicircular the section when applied. The width of the first light-emitting area 110 may be reduced by making semicircular the section of the first fluorescent resin 16 when applied, and therefore the size of the mounting substrate 10 may be smaller than when a fillet is formed at the bottom portion of the first fluorescent resin 16 when applied. After being applied, the first fluorescent resin 16 is cured by heat or ultraviolet rays. The first fluorescent resin 16 after being applied may be in a temporarily cured state where bridge construction is not perfect.

In the third process, the dam material 15 before being cured is applied with a dispenser and cured. Then, in the fourth process, the second fluorescent resin 17 is applied with a dispenser and cured. In the LED module 1, it is necessary to strictly manage the emitted light color of the second light-emitting area 120 whose area is larger than that of the first light-emitting area 110, and therefore it is necessary to manufacture the thickness of the second fluorescent resin 17 of the second light-emitting area 120 at a tolerance of about ±50 μm. On the other hand, the manufacturing accuracy of the thickness of the second fluorescent resin 17 of the first light-emitting area 110 may be lower than that of the thickness of the second fluorescent resin 17 of the second light-emitting area 120.

In the LED module 1, the first fluorescent resin 16 and the second fluorescent resin 17 are connected directly without intervention of a dam material. The viscosity of the first fluorescent resin 16 before being cured when applied is higher than the viscosity of the second fluorescent resin 17 before being cured when applied, and therefore the section of the section of the first fluorescent resin 16 may be semicircular when applied.

Figure 3:
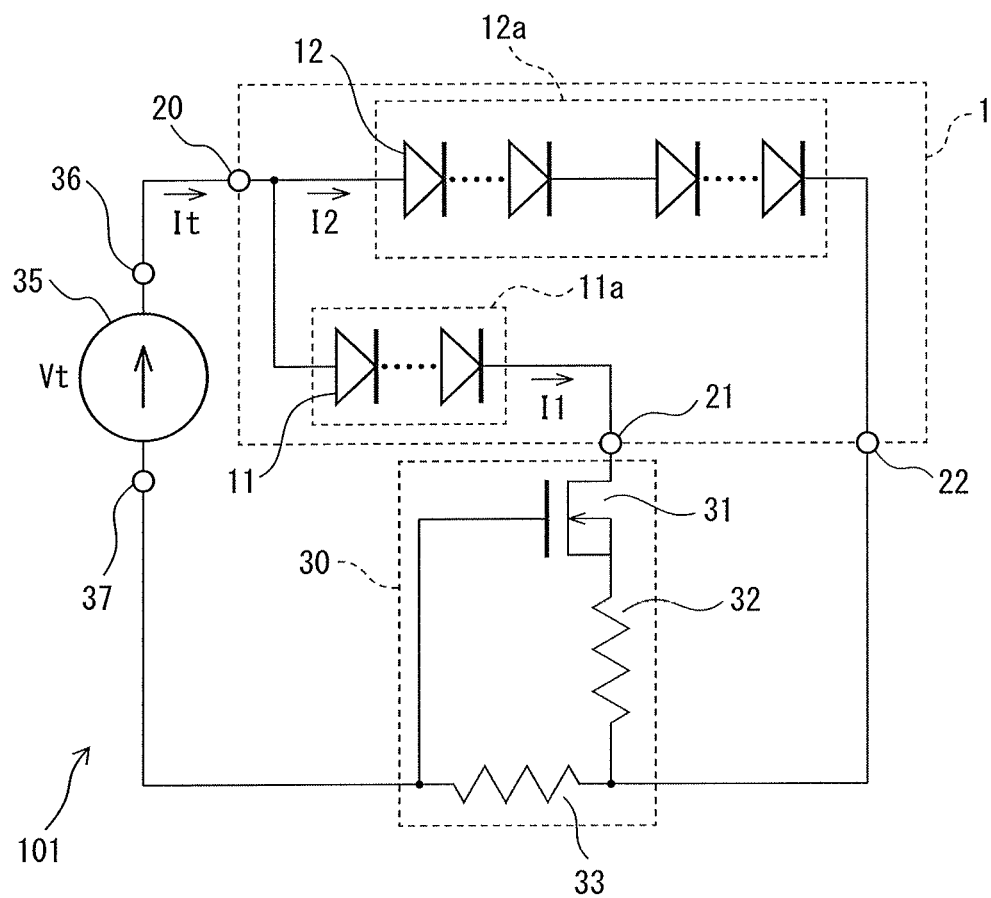
FIG. 3 a circuit block diagram of an LED drive circuit including the LED module illustrated in FIG. 1A.

FIG. 3 is a circuit block diagram of an LED drive circuit including the LED module 1.

An LED drive circuit 101 has the LED module 1, a current limiting circuit 30, and a variable constant current source 35. The LED module 1 has the first LED group 11a including the first LEDs 11 connected in series and the second LED group 12a including the second LEDs 12 connected in series. The number of second LEDs 12 included in the second LED group 12a is larger than the number of first LEDs 11 included in the first LED group 11a.

The current limiting circuit 30 has a depletion FET 31 (hereinafter, also referred to simply as FET), a first resistance element 32, and a second resistance element 33 and controls light emission of the first LEDs 11 included in the first LED group 11a and the second LEDs 12 included in the second LED group 12a. The variable constant current source 35 is capable of changing the value of an output current It in accordance with a control signal from an external device, not illustrated, and outputs a current in the direction of the arrow. In the variable constant current source 35, a terminal-to-terminal voltage Vt between a current output terminal 36 and a ground terminal 37 becomes high in accordance with an increase in the output current It. When the output current It of the variable constant current source 35 is small, the terminal-to-terminal voltage Vt of the variable constant current source 35 is low. When the output current It of the variable constant current source 35 is large, the terminal-to-terminal voltage Vt of the variable constant current source 35 is high.

The first LED group 11a is arranged in the first light-emitting area 110 that emits light in the first emitted light color by the plurality of first LEDs 11 connected in series emitting light. The anode of the first LED group 11a is connected to the current output terminal 36 that outputs the output current It of the variable constant current source 35 via the anode electrode 20. The cathode of the first LED group 11a is connected to the drain of the FET 31 via the first cathode electrode 21.

The second LED group 12a is arranged in the second light-emitting area 120 that emits light in the second emitted light color whose color temperature is higher than that of the first emitted light color by the plurality of second LEDs 12 connected in series emitting light. The anode of the second LED group 12a is connected to the current output terminal 36 of the variable constant current source 35 via the anode electrode 20. The cathode of the second LED group 12a is connected to one of the terminals of the first resistance element 32 and to one of the terminals of the second resistance element 33 via the second cathode electrode 22.

The source of the FET 31 is connected with the other terminal of the first resistance element 32 and the gate of the FET 31 is connected to the ground terminal 37 to which the output current It of the variable constant current source 35 returns as well as to the other terminal of the second resistance element 33.

The number of second LEDs 12 of the second LED group 12a is larger than the number of first LEDs 11 of the first LED group 11a, and therefore a second threshold voltage $V_{th2}$ at which the second LED 12 of the second LED group 12a emits light is higher than a first threshold voltage $V_{th1}$ at which the first LED 11 of the first LED group 11a emits light, since the threshold voltage of LEDs connected in series is the product of the voltage at which the LED starts to emit light and the number of serial stages. Further, the color temperature of the second emitted light color of the light emitted by the second LED group 12a coated with the second fluorescent resin 17 containing a yellow phosphor is higher than the color temperature of the first emitted light color of the light emitted by the first LED group 11a coated with the first fluorescent resin 16 containing a phosphor that emits light in a color between orange and red.

When the variable constant current source 35 controls the light output of the LED module 1 so as not to emit light, any of the plurality of first LEDs 11 included in the first LED group 11a and the plurality of second LEDs 12 included in the second LED group 12a does not emit light. When the variable constant current source 35 controls the light output of the LED module 1 so as not to emit light, the terminal-to-terminal voltage Vt of the variable constant current source 35 is lower than the first threshold voltage $V_{th1}$ of the first LED group 11a.

When the variable constant current source 35 controls the light output of the LED module 1 so as to emit low bright light, only the first LEDs 11 included in the first LED group 11a emit light and the output current It of the variable constant current source 35 flows through the first LED group 11a as a first current I1. When the variable constant current source 35 controls the light output of the LED module 1 so as to emit low bright light, the terminal-to-terminal voltage Vt of the variable constant current source 35 is higher than or equal to the first threshold voltage $V_{th1}$ of the first LED group 11a and lower than the second threshold voltage $V_{th2}$.

When the variable constant current source 35 controls the light output of the LED module 1 so as to emit medium bright light, the output current It of the variable constant current source 35 flows through the first LED group 11a and the second LED group 12a. The output current It of the variable constant current source 35 is the sum of the first current I1 that flows through the first LED group 11a and a second current I2 that flows through the second LED group 12a. When the variable constant current source 35 controls the light output of the LED module 1 so as to emit medium bright light, as the output current It of the variable constant current source 35 increases, a gate-to-source voltage Vgs of the FET 31, which is specified by a voltage drop of the second resistance element 33, becomes low because the second current I2 increases. When the gate-to-source voltage Vgs becomes low because the second current I2 increases, the first current I1 that flows through the FET 31 decreases. When the variable constant current source 35 controls the light output of the LED module 1 so as to emit medium bright light, the output current It of the variable constant current source 35 is a current by which the FET 31 turns on even if there is a voltage drop (that has contributed) of the second resistance element 33 based on the second current I2 and the terminal-to-terminal voltage Vt of the variable constant current source 35 is a voltage higher than or equal to the second threshold voltage $V_{th2}$ of the second LED group 12a.

When the variable constant current source 35 controls the light output of the LED module 1 so as to emit high bright light, the FET 31 turns off and the output current It of the variable constant current source 35 flows through the second LED group 12a as the second current I2. When the variable constant current source 35 controls the light output of the LED module 1 so as to emit high bright light, the output current It of the variable constant current source 35 is a current that turns off the FET 31 due to a voltage drop by the second current I2.

When the variable constant current source 35 controls the light output of the LED module 1 so as to emit low bright light, the LED drive circuit 101 causes the first LEDs 11 included in the first LED group 11a to emit light and does not cause the second LEDs 12 included in the second LED group 12a to emit light. When the variable constant current source 35 controls the light output of the LED module 1 so as to emit low bright light, the LED drive circuit 101 causes only the first LED group 11a arranged in the first light-emitting area 110 that emits light whose color temperature is low to emit light, and therefore the LED module 1 emits light whose color temperature is low.

When the variable constant current source 35 controls the light output of the LED module 1 so as to emit medium bright light, the LED drive circuit 101 causes both the first LEDs 11 included in the first LED group 11a and the second LEDs 12 included in the second LED group 12a to emit light. In the LED drive circuit 101, when the light output of the LED module 1 is controlled so as to emit medium bright light, the light output is controlled so that the light emitted from the second light-emitting area 120 becomes brighter as well as the light emitted from the first light-emitting area 110 becomes less bright as the output current It of the variable constant current source 35 increases.

When the variable constant current source 35 controls the light output of the LED module 1 so as to emit high bright light, the LED drive circuit 101 does not cause the first LEDs 11 included in the first LED group 11a to emit light but causes the second LEDs 12 included in the second LED group 12a to emit light. When the light output of the LED module 1 is controlled so as to emit high bright light, the LED drive circuit 101 causes only the second LED group 12a arranged in the second light-emitting area 120 that emits light whose color temperature is high to emit light, and therefore the LED module 1 emits light whose color temperature is high.

The LED drive circuit 101 may implement emitted-light-color characteristics to light-output control similar to those of an incandescent lamp by emitting light whose color temperature is low when the light output of the LED module 1 is controlled so as to emit low bright light, by emitting light that is a mixture of light whose color temperature is low and light whose color temperature is high when the light output of the LED module 1 is controlled so as to emit medium bright light, and by emitting light whose color temperature is high when the light output of the LED module 1 is controlled so as to emit high bright light. Further, in the LED drive circuit 101, the light emission of the second light-emitting area 120 is more predominant, and therefore the emitted light color of the LED module 1 is managed by the emitted light color of the second light-emitting area 120.

In the LED module 1, because the shape of the dam material 15 whose inner wall comes into contact with the outer contour of the second light-emitting area 120, which is the main light-emitting area, is annular, the planar shape of the second light-emitting area 120 is substantially circular. In the LED module 1, because the planar shape of the second light-emitting area 120, which is the main light-emitting area, is substantially circular, the design of optical systems, such as a lens, becomes easy, and it is easy to adjust various characteristics, such as color mixing properties. Further, because the second light-emitting area 120 is formed so as to surround the first light-emitting area 110, which is an auxiliary light-emitting area, it is easy to blur the boundary portion between the first light-emitting area 110 and the second light-emitting area 120. In the LED module 1, because the main light-emitting area is substantially circular and the main light-emitting area is formed so as to surround the auxiliary light-emitting area, color mixing properties can be maintained high.

In the LED module 1, since the section of the first fluorescent resin 16 is hemispheric, the thickness of the portion may be gradually changed at which the first fluorescent resin 16 and the second fluorescent resin 17 overlap each other as well the application portion of the first fluorescent resin 16 may be narrow, and therefore color mixing properties improve.

In the LED module 1, the second fluorescent resin 17 is arranged above the first fluorescent resin 16, and therefore color mixing properties improve and at the same time, manufacturing of LED modules is easy because it is necessary to manage only the thickness of the second fluorescent resin 17 at the time of filling with the fluorescent resin. Further, in the LED module 1, the dam material may be omitted that serves as a demarcation between the first light-emitting area 110 and the second light-emitting area 120 by making the viscosity of the first fluorescent resin 16 differ from that of the second fluorescent resin 17, and therefore manufacturing is easy. Furthermore, in the LED module 1, there is no dam material that serves as a demarcation between the first light-emitting area 110 and the second light-emitting area 120, and therefore it may be difficult to visually recognize the difference between the first light-emitting area 110 and the second light-emitting area 120 when the LED module is not lit.

In the LED module 1, the first light-emitting area 110 emits light whose color temperature is low and the second light-emitting area 120 emits light whose color temperature is high. The LED module 1 has a structure having the first light-emitting area and the second light-emitting area that emit light whose emitted light colors are different on a downsized mounting substrate by a simple manufacturing method and that easily improve color mixing properties. The LED drive circuit 101 may easily implement the emitted-light-color characteristics to light-output control similar to those of an incandescent lamp, by incorporating the LED module 1 in the LED drive circuit 101 along with the current limiting circuit 30.

In the LED module 1, the length H between the vertex portion of the first fluorescent resin 16 and the top surface of the first LED 11 is longer than the length W in the width direction of the first LED 11, and therefore when curing the first fluorescent resin 16 by heat or ultraviolet rays, "waviness" may be prevented in which the side surface of the first fluorescent resin 16 deforms.

In the LED module 1, the extending direction of the wire 13 when the wire 13 is viewed in a plane is parallel to the first direction in which the first light-emitting area 110 extends, and therefore the first fluorescent resin 16 may be prevented from clustering on one of the side surfaces of the first LED 11 when applying the first fluorescent resin 16. Further, the extending direction of the wire 13 when the wire 13 is viewed in a plane is parallel to the first direction in which the first light-emitting area 110 extends, and therefore it is slight for the wire 13 to uncouple from the first LED 11 in applying the first fluorescent resin 16.

Although the first light-emitting area 110 in the LED module 1 has a rod-like planar shape, the planar shape of the first light-emitting area in the LED module according to the embodiment is not limited to the shape of a rod and may be, for example, circular. However, if the planar shape of the first light-emitting area is made into the shape of a rod as in the LED module 1, it is necessary to apply the first fluorescent resin 16 linearly with a dispenser only once, and therefore the manufacturing process may be easier.

Second Embodiment

Figure 4:
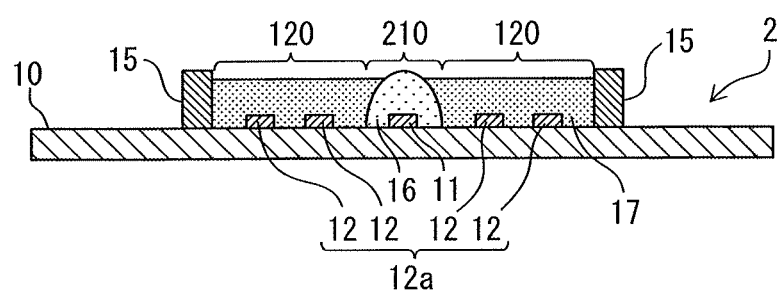
FIG. 4 is a sectional view of an LED module according to the second embodiment.

In the LED module 1, the second fluorescent resin 17 exists above the first fluorescent resin 16 in the first light-emitting area 110. However, an LED module according to an embodiment is not limited to the case where the phosphor resin making up the second light-emitting area arranged outside the first light-emitting area exists across the entire top portion of the first light-emitting area. With reference to FIG. 4, a structure of an LED module in which the phosphor resin making up the second light-emitting area exists only on part of the top portion of the first light-emitting area is explained as a second embodiment.

FIG. 4 is a sectional view of an LED module 2 according to the second embodiment. When the LED module 2 is viewed in a plane, the plan view of the LED module 2 is almost the same as the plan view of the LED module 1 illustrated in FIG. 1, and therefore the plan view of the LED module 2 is not illustrated. FIG. 4 is a sectional view drawn along a line corresponding to AA line in FIG. 1. The difference between the LED module 2 and the LED module 1 lies in that the first fluorescent resin 16 protrudes from the top surface of the second fluorescent resin 17. In the LED module 2, the first fluorescent resin 16 protrudes from the top surface of the second fluorescent resin 17, and therefore in a first light-emitting area 210, on the periphery of the protruding portion of the first fluorescent resin 16, the second fluorescent resin 17 is stacked on the top portion of the first fluorescent resin 16.

In the LED module 2, the first fluorescent resin 16 may be thickly applied, and therefore it is easier to manufacture the LED module 2 compared to the manufacturing method of the LED module 1.

Third Embodiment

Figure 6:
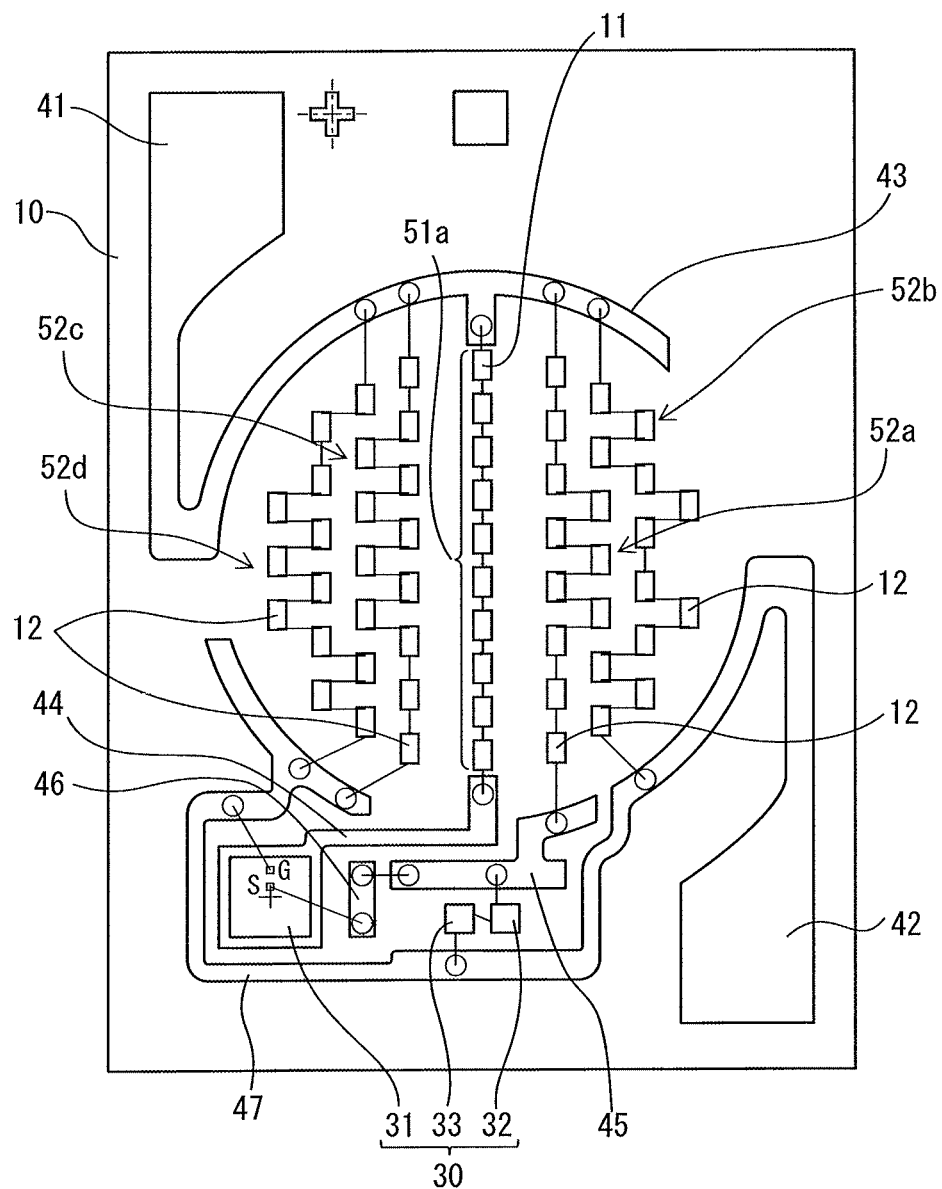
FIG. 6 is a diagram illustrating a substrate of the LED module illustrated in FIG. 5A before a dam material and a fluorescent resin are applied.
Figure 7:
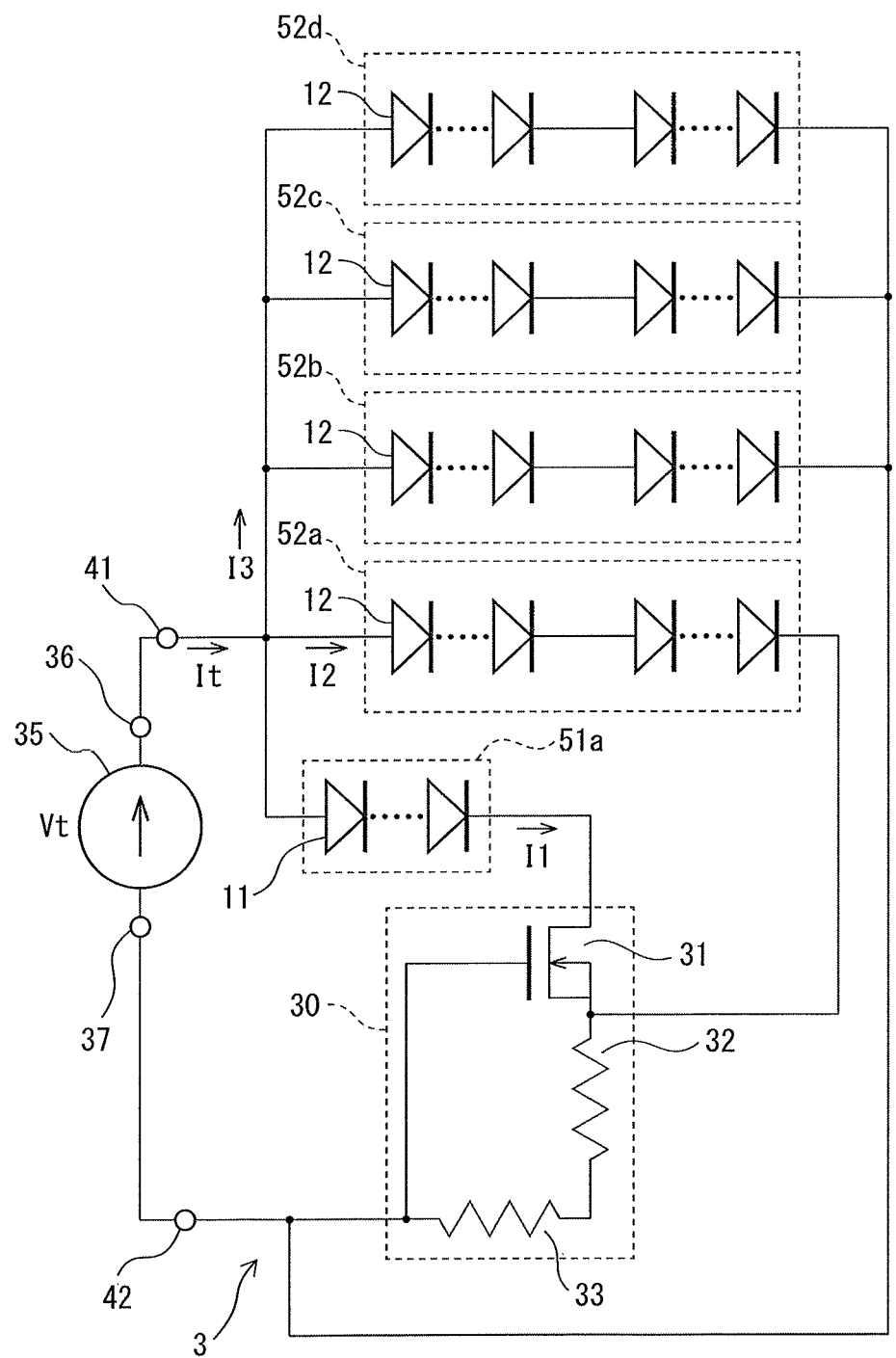
FIG. 7 is a circuit block diagram of the LED module illustrated in FIG. 5A.

FIG. 5A is a plan view of an LED module 3 according to a third embodiment, FIG. 5B is a sectional view along AA line illustrated in FIG. 5A, FIG. 5C is a right side view of the LED module 3, and FIG. 5D is a front view of the LED module 3. FIG. 6 is a diagram illustrating a substrate of the LED module 3 before a dam material and a fluorescent resin are applied and FIG. 7 is a circuit block diagram of the LED module 3.

In the LED module 3, a first LED group 51a, a second-1 LED group 52a, a second-2 LED group 52b, a second-3 LED group 52c, a second-4 LED group 52d, and the current limiting circuit 30 are mounted on the single substrate 10. The LED module 3 differs from the LED module 1 in having a power source control circuit area 130 on which the current limiting circuit 30 is mounted and a power source circuit dam material 18 arranged around the power source control circuit area 130. Further, the LED module 3 differs from the LED module 1 in that an anode electrode 41 is arranged in place of the anode electrode 21 and a cathode electrode 42 is arranged in place of the first cathode electrode 21 and the second cathode electrode 22. Furthermore, the LED module 3 differs from the LED module 1 in that the first LED group 51a is arranged in place of the first LED group 11a. Still furthermore, the LED module 3 differs from the LED module 1 in that the second-1 LED group 52a to the second-4 LED group 52d are arranged in place of the second LED group 12a. The configuration and function of the substrate 10 and the dam material 15 of the LED module 3 are the same as those of the LED module 1, and therefore detailed explanation is omitted here.

The first LED group 51a is arranged in a first light-emitting area 510 along with the first fluorescent resin 16. The first LED group 51a has the ten first LEDs 11 connected in series and the anode of the first LED group 51a is connected to the anode electrode 41 via an anode wiring system 43 and the cathode of the first LED group 51a is connected to the drain of the FET 31 via a first cathode wiring system 44.

The second-1 LED group 52a to the second-4 LED group 52d are arranged in a second light-emitting area 520 along with the second fluorescent resin 17.

The second-1 LED group 52a has the eleven second LEDs 12 connected in series. The anode of the second-1 LED group 52a is connected to the anode electrode 41 via the anode wiring system 43 and the cathode of the second-1 LED group 52a is connected to the first resistance element 32 via a second cathode wiring system 45. The cathode of the second-1 LED group 52a is connected to the source of the FET 31 via the second cathode wiring system 45 and a third cathode wiring system 46.

The second-2 LED group 52b to the second-4 LED group 52d have the twelve second LEDs 12 connected in series and are connected in parallel. The anodes of the second-2 LED group 52b to the second-4 LED group 52d are connected to the anode electrode 41 via the anode wiring system 43 and the cathodes of the second-2 LED group 52b to the second-4 LED group 52d are connected to the cathode electrode 42 via a fourth cathode wiring system 47.

When the variable constant current source 35 controls the light output of the LED module 3 so as not to emit light, any of the first LEDs 11 included in the first LED group 51a and the second LEDs 12 included in the second-1 LED group 52a to the second-4 LED group 52d does not emit light.

When the variable constant current source 35 controls the light output of the LED module 3 so as to emit low bright light, the output current It flows through the first LED group 51a: When the variable constant current source 35 controls the light output of the LED module 3 so as to emit low bright light, the terminal-to-terminal voltage Vt of the variable constant current source 35 is higher than or equal to the first threshold voltage $V_{th1}$ of the first LED group 51a including the ten first LEDs 11 and lower than a second-1 threshold voltage $V_{th2-1}$ of the second-1 LED group 52a including the eleven second LEDs 12.

When the variable constant current source 35 controls the light output of the LED module 3 so as to emit medium bright light, the output current It flows through the first LED group 51a and the second-1 LED group 52a. When the variable constant current source 35 controls the light output of the LED module 3 so as to emit medium bright light, the output current It of the variable constant current source 35 is a current that turns on the FET 31 even if there is a voltage drop (that has contributed) of the second resistance element 33 based on the current I2 and the terminal-to-terminal voltage Vt of the variable constant current source 35 is higher than or equal to the second-1 threshold voltage $V_{th2-1}$ of the second-1 LED group 52a. The output current It of the variable constant current source 35 is the sum of the first current I1 that flows through the first LED group 51a and the second current I2 that flows through the second-1 LED group 52a. When the variable constant current source 35 controls the light output of the LED module 3 so as to emit medium bright light, as the output current It of the variable constant current source 35 increases, the gate-to-source voltage Vgs of the FET 31 specified by a voltage drop of the first resistance element 32 and the second resistance element 33 becomes low because the second current I2 increases. When the gate-to-source voltage Vgs becomes low because the second current I2 increases, the first current I1 that flows through the FET 31 decreases. When the output current It of the variable constant current source 35 further increases and the FET 31 turns off, the output current It of the variable constant current source 35 flows through the second-1 LED group 52a as the second current I2 (corresponding to the case where the light output of the LED module 3 is controlled so as to emit bright light).

When the variable constant current source 35 controls the light output of the LED module 3 so as to emit the highest bright light, the output current It flows through the second-1 LED group 52a to the second-4 LED group 52d as the second current I2 and a third current I3. When the variable constant current source 35 controls the light output of the LED module 3 so as to emit the highest bright light, the terminal-to-terminal voltage Vt of the variable constant current source 35 is a voltage higher than or equal to a second-2 threshold voltage $V_{th2-2}$ of the second-2 LED group 52b to the second-4 LED group 52d including the twelve second LEDs 12.

Figure 8:
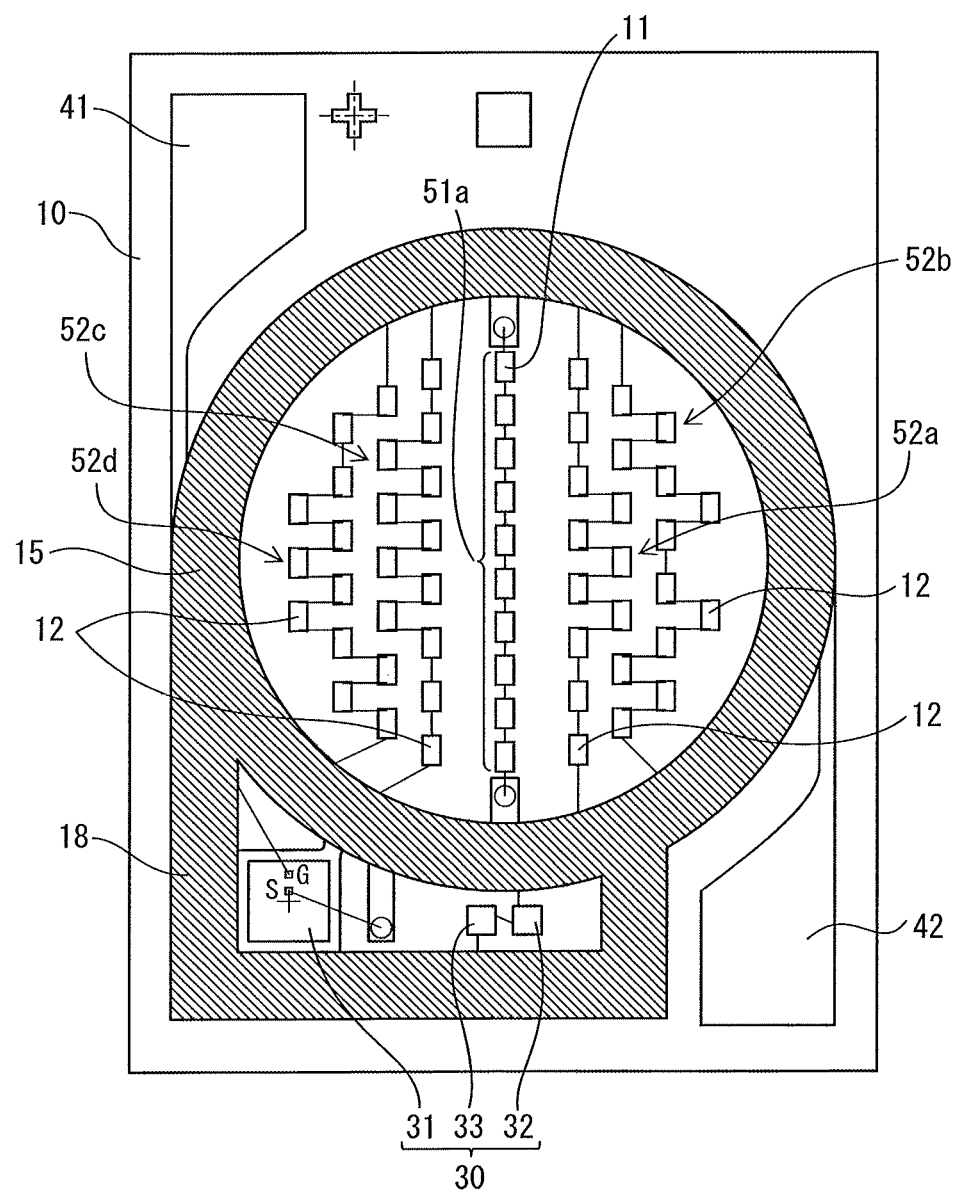
FIG. 8 illustrates a second process of the LED module illustrated in FIG. 5A.
Figure 9:
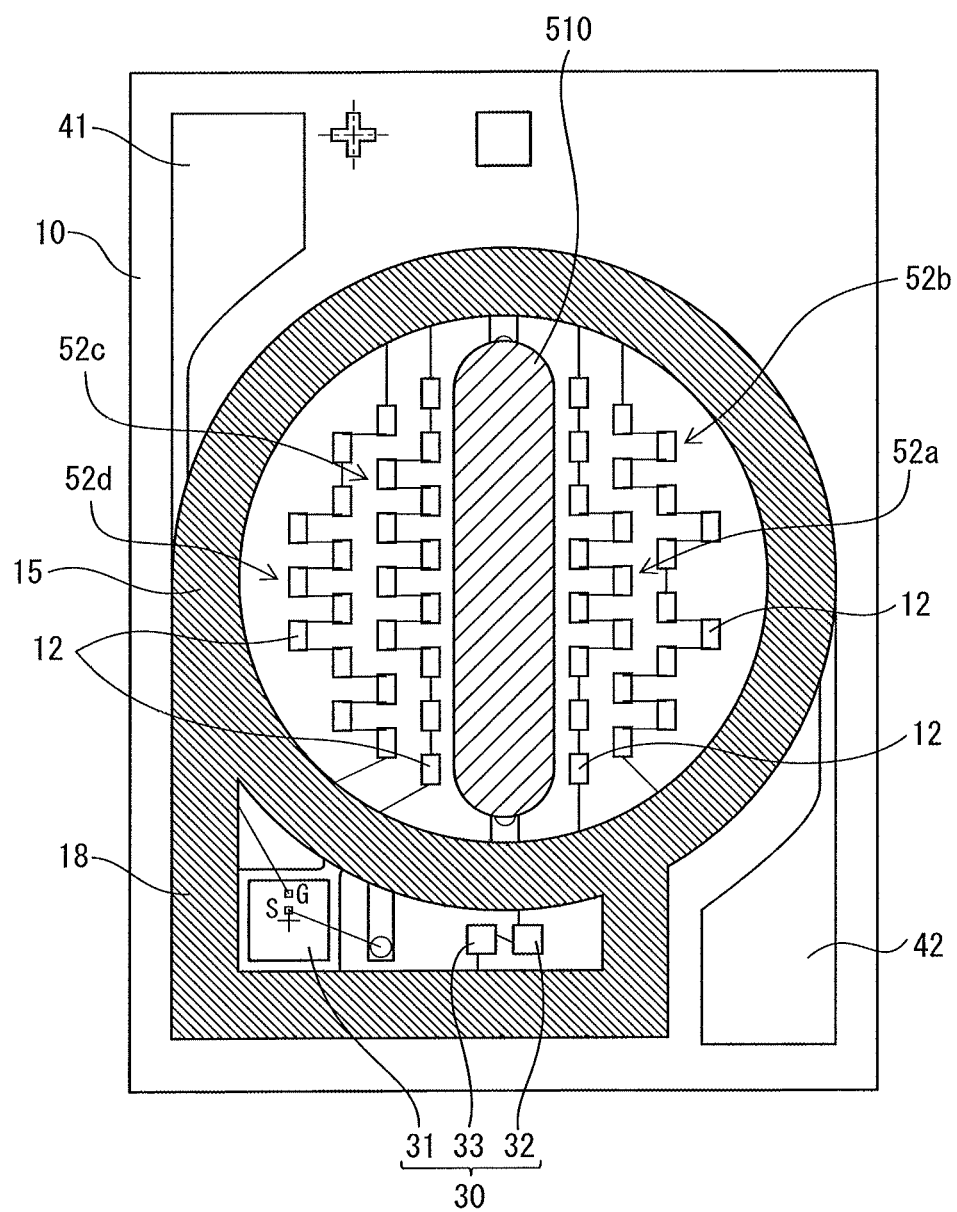
FIG. 9 illustrates a third process of the LED module illustrated in FIG. 5A.
Figure 10C:
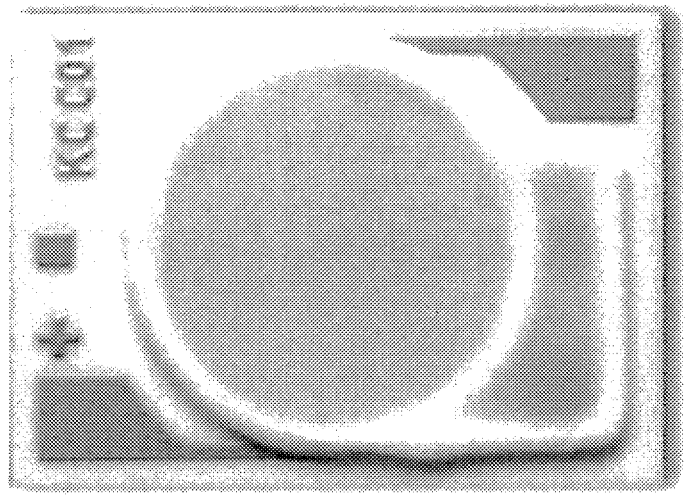
FIG. 10C a diagram illustrating a planar image of a fourth process.
Figure 10B:
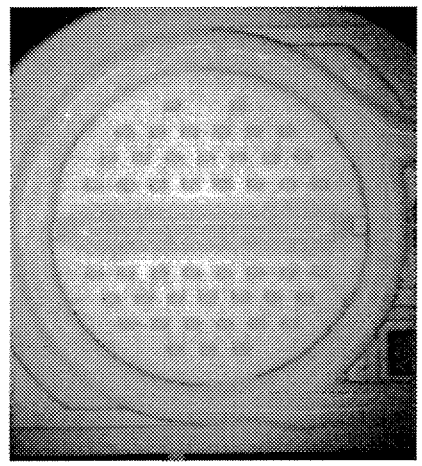
FIG. 10B a diagram illustrating a planar image of the third process.
Figure 10A:
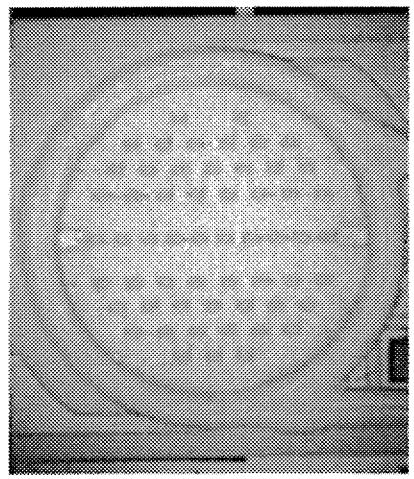
FIG. 10A a diagram illustrating a planar image of the second process.

With reference to FIG. 6, FIG. 8, FIG. 9, and FIG. 10A to FIG. 10O, a manufacturing method of the LED module 3 is explained. FIG. 8 illustrates a second process and FIG. 9 illustrates a third process. FIG. 10A is a diagram illustrating a planar image of the second process, FIG. 10B is a diagram illustrating a planar image of the third process, and FIG. 10O is a diagram illustrating a planar image of a fourth process.

In a first process, the mounting substrate 10 illustrated in FIG. 6 is prepared on which the first LED group 51a including the ten first LEDs 11, the second-1 LED group 52a to the second-4 LED group 52d including the eleven or twelve second LEDs 12, and the current limiting circuit 30 are mounted. Next, in the second process, the dam material 15 and the power source control circuit dam material 18 are applied with a dispenser and cured. The dam material 15 and the power source control circuit dam material 18 are cured by applying heat at a temperature of 120° C. for one hour. Next, in the third process, the first fluorescent resin 16 is applied to the portion corresponding to first light-emitting area 510 with a dispenser and temporarily cured. The first fluorescent resin 16 is temporarily cured by reflow for about two minutes. Next, in the fourth process, the second fluorescent resin 17 is applied to the portion corresponding to the second light-emitting area 520 and the power source control circuit area 130 with a dispenser and cured. The second fluorescent resin 17 is cured by applying heat at a temperature of 150° C. for three hours after applying heat at a temperature of 120° C. for two hours. When the second fluorescent resin 17 is cured, the first fluorescent resin 16 is also cured at the same time.

In the LED module 3, the LED groups having the same configuration as those of the LED module 1 and the current limiting circuit 30 are mounted on the single substrate 10, and therefore the functions of both the LED module 1 and the current limiting circuit 30 may be implemented on a single substrate.

Further, in the LED module 3, the second fluorescent resin 17 is used as a sealing material to seal the power source control circuit area 130, and therefore the power source control circuit area 130 may be sealed by simultaneously applying the second fluorescent resin 17 to the second light-emitting area 520 and the power source control circuit area 130. For the LED module 3, the number of manufacturing processes may be reduced than in the case where the power source control circuit area 130 is sealed by using a sealing material other than the second fluorescent resin 17 as a sealing material to seal the power source control circuit area 130.

When the variable constant current source 35 controls the light output of the LED module 3 so as to emit high bright light and the second light-emitting area 520 emits light, through the first resistance element 32 and the second resistance element 33 of the current limiting circuit 30, the second current I2 via the second-1 LED group 52a flows, but the third current I3 does not flow. When the variable constant current source 35 controls the light output of the LED module 3 so as to emit the highest bright light, only the current (second current I2) via part of the LEDs of the second light-emitting area 520 flows through the first resistance element 32 and the second resistance element 33 of the current limiting circuit 30, and therefore power consumption may be suppressed than the LED drive circuit 101.

Fourth Embodiment

Figure 12:
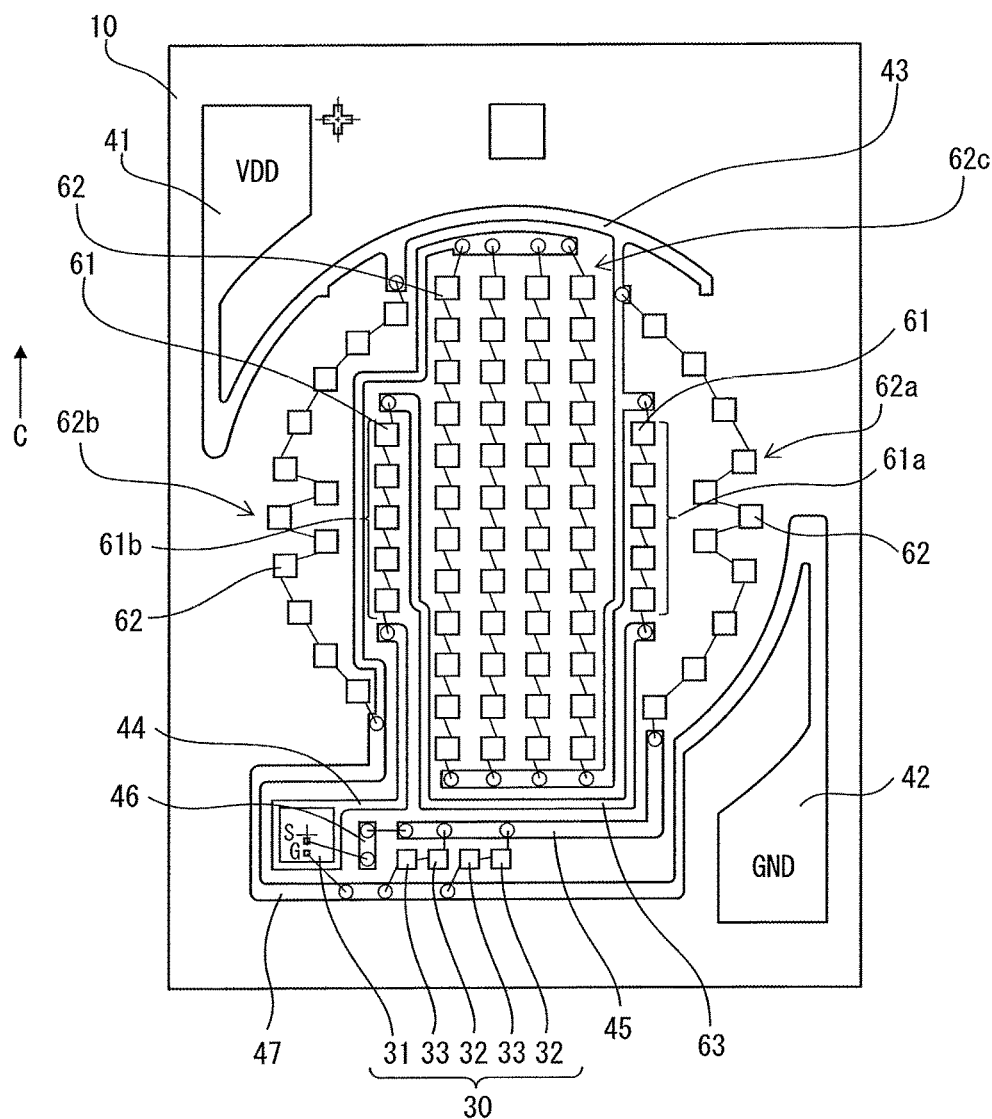
FIG. 12 is a diagram illustrating a substrate of the LED module illustrated in FIG. 11A before a dam material and a fluorescent resin are applied

FIG. 11A is a plan view of an LED module 4 according to a fourth embodiment, FIG. 11B is a sectional view along AA line illustrated in FIG. 11A, FIG. 11C is a right side view of the LED module 4, and FIG. 11D is a front view of the LED module 4. FIG. 12 is a diagram illustrating a substrate of the LED module 4 before a dam material and a fluorescent resin are applied.

The LED module 4 differs from the LED module 3 in that a first-1 light-emitting area 611 and a first-2 light-emitting area 612 are formed in place of the first light-emitting area 510. Further, the LED module 4 differs from the LED module 3 in that a second light-emitting area 620 is formed in place of the second light-emitting area 520. The configuration of the LED module 4 other than the first-1 light-emitting area 611, the first-2 light-emitting area 612, and the second light-emitting area 620 is the same as that of the LED module 3, and therefore detailed explanation is omitted here.

In the first-1 light-emitting area 611 and the first-2 light-emitting area 612, a plurality of first LEDs 61 is arranged and in the second light-emitting area 620, a plurality of second LEDs 62 is arranged. Each of the first LED 61 and the second LED 62 is a blue light-emitting diode like the first LED 11 and the second LED 12.

In the first-1 light-emitting area 611, a first-1 LED group 61a including the five first LEDs 61 connected in series and the first fluorescent resin 16 are arranged. The anode of the first-1 LED group 61a is connected to the anode electrode 41 via the anode wiring system 43 and the cathode of the first-1 LED group 61a is connected to a connection wiring system 63.

In the first-2 light-emitting area 612, a first-2 LED group 61b including the five first LEDs 61 connected in series and the first fluorescent resin 16 are arranged. The anode of the first-2 LED group 61b is connected to the connection wiring system 63 and the cathode of the first-2 LED group 61b is connected to the drain of the FET 31 via the first cathode wiring system 44. The first-1 LED group 61a and the first-2 LED group 61b are connected in series via the connection wiring system 63, and therefore the ten first LEDs 61 included in the first-1 LED group 61a and the first-2 LED group 61b are connected in series via the connection wiring system 63.

In the second light-emitting area 620, a second-1 LED group 62a, a second-2 LED group 62b, a second-3 LED group 62c, and the second fluorescent resin 17 are arranged. The second-1 LED group 62a includes the eleven second LEDs 62 connected in series and the second-2 LED group 62b includes the twelve second LEDs 62 connected in series. The second-3 LED group 62c includes the 48 second LEDs 62 in all in which the four strings of the twelve second LEDs 62 connected in series are connected in parallel.

When connected to the variable constant current source 35, the LED module 4 performs the same operation as that of the LED module 3, and therefore detailed explanation of the operation of the LED module 4 is omitted.

In the LED module 4, the area that emits light whose color temperature is low is divided into two areas, i.e., the first-1 light-emitting area 611 and the first-2 light-emitting area 612, and arranged so as to be surrounded by the second light-emitting area 620 that emits light whose color temperature is high, and therefore color mixing properties improve more than the LED module 3.

Although each of the first LED 61 and the second LED 62 has a square planar shape in the LED module 4, LEDs having a rectangular planar shape may be arranged like the first LED 11 and the second LED 12 of the LED module 3.

Figure 13A:
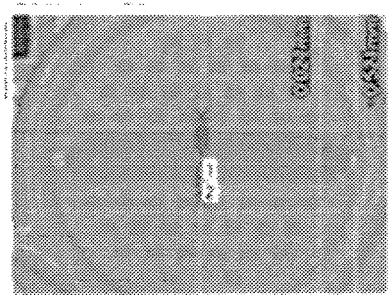
FIG. 13A is a diagram illustrating an example of a planar image of the LED module.
Figure 13B:
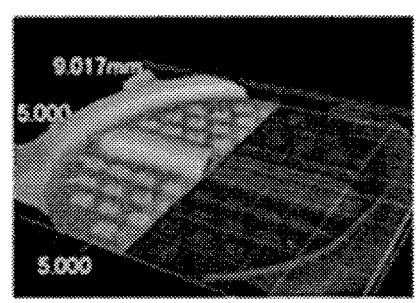
FIG. 13B is a diagram illustrating a perspective image of the LED module illustrated in FIG. 13A.
Figure 13C:
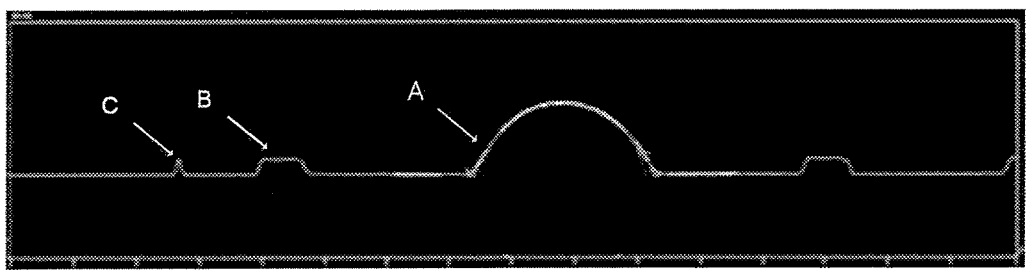
FIG. 13C is an enlarged sectional view of the vicinity of the first light-emitting area of the LED module illustrated in FIG. 13A.
Figure 15:
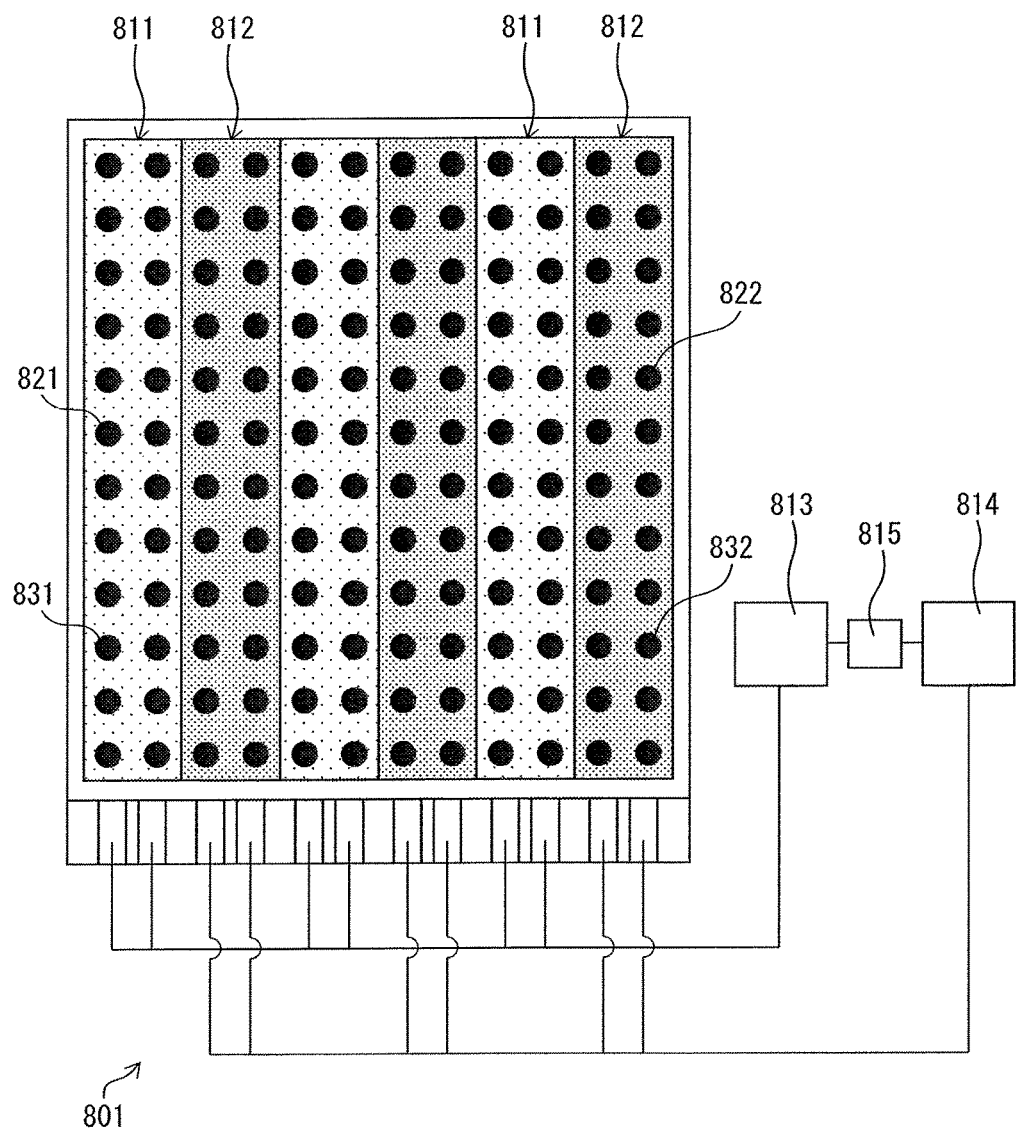
FIG. 15 is a plan view of an LED module, which is a light-emitting device including a plurality of belt-shaped light-emitting areas.
Figure 16:
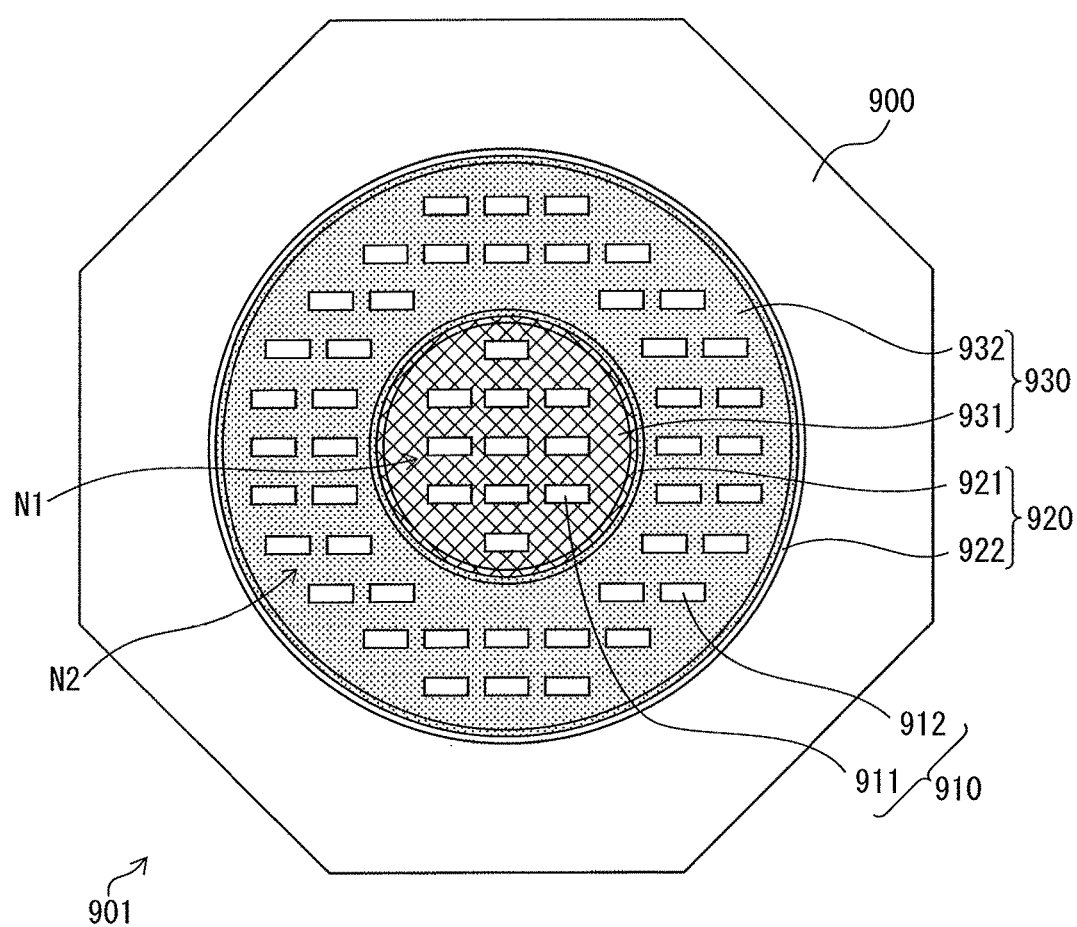
FIG. 16 is a plan view of an LED module 901 in which two areas are arranged concentrically.

FIG. 13A is a diagram illustrating an example of a planar image of the LED module 3, FIG. 13B is a diagram illustrating a perspective image of the LED module 3 illustrated in FIG. 13A, and FIG. 13C is an enlarged sectional view of the vicinity of the first light-emitting area 610 of the LED module 3 illustrated in FIG. 13A.

In the example illustrated in FIG. 13A to FIG. 13C, the length of the long side of the first LED 11 is 0.56 mm, the length of the short side of the LED 11 is 0.36 mm, the height of the first fluorescent resin 16 is 0.59 mm, and the width of the lower end of the first fluorescent resin 16 is 1.8 mm. In the example illustrated in FIG. 13A to FIG. 13C, the viscosity of the first fluorescent resin 16 is too high to measure, and therefore the viscosity of the first fluorescent resin 16 is managed by the shape of the first fluorescent resin 16.

In the example illustrated in FIG. 13A to FIG. 13C, the second fluorescent resin 17 is applied so as to be uniformly thick, and therefore the first light-emitting area 110 protrudes in the shape of a semicircle in accordance with the shape of the section of the first fluorescent resin 16 as indicated by arrow A. The length of the lower end portion of the protruding portion indicated by arrow A is 1.472 mm. Further, as indicated by arrow B, the portion where the second LED 12 is arranged protrudes in the shape of a rectangle in accordance with the shape of the second LED 12. The beard-like protruding portion indicated by arrow C is a portion that protrudes in accordance with a wire.

FIG. 14A to FIG. 14I are each a diagram illustrating the shape of the first light-emitting area 110 when the length H between the vertex portion of the first fluorescent resin 16 and the top surface of the first LED 11 coated with the first fluorescent resin 16 is changed. FIG. 14A illustrates a planar image in the state where the first fluorescent resin 16 is not arranged, FIG. 14B illustrates a planar image of the first light-emitting area 110 when the length H is 3.4 mm, and FIG. 14C illustrates a planar image of the first light-emitting area 110 when the length H is 3.8 mm. FIG. 14D illustrates a planar image of the first light-emitting area 110 when the length H is 4.0 mm, FIG. 14E illustrates a planar image of the first light-emitting area 110 when the length H is 4.2 mm, and FIG. 14F illustrates a planar image of the first light-emitting area 110 when the length H is 4.6 mm. FIG. 14G illustrates a planar image of the first light-emitting area 110 when the length H is 4.8 mm, FIG. 14H illustrates a planar image of the first light-emitting area 110 when the length H is 5.0 mm, and FIG. 14I illustrates a planar image of the first light-emitting area 110 when the length H is 5.4 mm.

When the length H is 3.4 mm, in the first light-emitting area 110, large "waviness" occurs, and therefore the side surface of the first light-emitting area 110 bends. When the length H is 3.8 mm, in the first light-emitting area 110, although slight "waviness" occurs, the side surface of the first light-emitting area 110 hardly bends. When the length H is 4.0 mm or more, "waviness" does not occur at all. In order to avoid waviness, in the examples illustrated in FIG. 14A to FIG. 14I, the viscosity of the first fluorescent resin 16 is managed by the shape of the first fluorescent resin 16 because the viscosity of the first fluorescent resin 16 is too high to measure.

When the length H is shorter than 0.36 mm, which is the width of the first LED 11, in the first light-emitting area 110, large "waviness" occurs. On the other hand, when the length H is longer than 0.36 mm, which is the width of the first LED 11, "waviness" does not easily occur in the first light-emitting area 110.

EXPLANATION OF LETTERS OR NUMERALS

1 to 4 LED module
10 mounting substrate
11, 12, 61, 62 LED
11a first LED group
12a second LED group
15 dam material
16 first fluorescent resin
30 current limiting circuit
31 FET (depletion FET)
32, 33 resistance element
35 variable constant current source
101 LED drive circuit
110, 510, 610 first light-emitting area
120, 520, 611, 612 second light-emitting area

What is claimed is:
1. An LED module comprising:
a mounting substrate;
a first LED group including a plurality of LEDs mounted in a first light-emitting area extending in a first direction on the mounting substrate;
a second LED group including a plurality of LEDs mounted in a second light-emitting area located outside the first light-emitting area;
a first dam material surrounding a periphery of the second light-emitting area;
a first fluorescent resin coating the first LED group and causing the first light-emitting area to emit light having a first color temperature; and
a second fluorescent resin coating at least the second LED group and causing the second light-emitting area to emit light having a second color temperature higher than the first color temperature, and
a current limiting circuit arranged on the mounting substrate, and configured to control light emission of the LEDs included in the first LED group and the second LED group, wherein
the current limiting circuit is adjacent to the first dam material and surrounded by a second dam material,
viscosity of the first fluorescent resin is higher than viscosity of the second fluorescent resin before being cured, and
the first fluorescent resin and the second fluorescent resin are connected directly without intervention of a dam material,
the current limiting circuit is configured to control light emission of the LEDs included in the first LED group and the second LED group so as to enter a first light-emitting state where the LEDs included in the first LED group are caused to emit light and the LEDs included in the second LED group are not caused to emit light, a second light-emitting state where the LEDs included in the first LED group and the second

LED group are caused to emit light, and a third light-emitting state where the LEDs included in the first LED group are not caused to emit light and the LEDs included in the second LED group are caused to emit light, the current limiting circuit comprises an FET whose drain is connected with the first LED group, and whose source is connected with the second LED group, and the current limiting circuit decreases a current that is supplied to the LEDs included in the first LED group and flows from the drain to the source, as a current that is supplied to the LEDs included in the first LED group and the second LED group increases in the second light-emitting state by changing the voltage between the source and the gate of the FET.

2. The LED module according to claim 1, wherein a length between a vertex portion of the first fluorescent resin and a top surface of an LED coated with the first fluorescent resin is longer than a length in a width direction perpendicular to the first direction of the LED coated with the first fluorescent resin.

3. The LED module according to claim 2, wherein each of a plurality of LEDs included in the first LED group has a rectangular planar shape, and each of the plurality of LEDs included in the first LED group is arranged so that an extending direction of a long side is parallel to the first direction.

4. The LED module according to claim 3, wherein an extending direction of all wires connecting between a plurality of LEDs included in the first LED group is parallel to the first direction.

5. The LED module according to claim 1, wherein an outer contour of the second light-emitting area is circular.

6. The LED module according to claim 1, wherein a section perpendicular to the first direction of the first fluorescent resin is hemispheric.

7. The LED module according to claim 1, wherein the current limiting circuit is sealed by the second fluorescent resin.

* * * * *